(12) United States Patent
Nair et al.

(10) Patent No.: US 9,461,185 B2
(45) Date of Patent: Oct. 4, 2016

(54) ANTI-REFLECTIVE AND ANTI-SOILING COATINGS WITH SELF-CLEANING PROPERTIES

(71) Applicant: Enki Technology, Inc., San Jose, CA (US)

(72) Inventors: Vinod Nair, San Jose, CA (US); Brenor L. Brophy, San Jose, CA (US)

(73) Assignee: Enki Technology, Inc., San Jose, CA (US)

( * ) Notice: Subject to any disclaimer, the term of this patent is extended or adjusted under 35 U.S.C. 154(b) by 0 days.

(21) Appl. No.: 14/852,872

(22) Filed: Sep. 14, 2015

(65) Prior Publication Data

US 2016/0035912 A1 Feb. 4, 2016

Related U.S. Application Data

(63) Continuation of application No. 14/488,923, filed on Sep. 17, 2014, which is a continuation-in-part of application No. 13/184,568, filed on Jul. 18, 2011, now Pat. No. 8,864,897, which is a continuation-in-part of application No. 12/769,580, filed on Apr. 28, 2010, now abandoned.

(60) Provisional application No. 61/174,430, filed on Apr. 30, 2009.

(51) Int. Cl.
*B32B 17/06* (2006.01)
*C03C 17/30* (2006.01)
(Continued)

(52) U.S. Cl.
CPC ....... *H01L 31/02168* (2013.01); *C03C 17/007* (2013.01); *C03C 17/30* (2013.01); *C08G 77/24* (2013.01); *C09D 5/006* (2013.01); *C09D 5/1662* (2013.01); *C09D 183/08* (2013.01); *H01L 31/022466* (2013.01); *C03C 2203/27* (2013.01); *C03C 2217/20* (2013.01); *C03C 2217/425* (2013.01); *C03C 2217/732* (2013.01); *C03C 2217/76* (2013.01); *C03C 2217/78* (2013.01);
(Continued)

(58) Field of Classification Search
USPC ....... 428/426, 428, 429, 432, 688, 689, 702; 106/287.14, 287.16
See application file for complete search history.

(56) References Cited

U.S. PATENT DOCUMENTS 2,432,484 A 12/1947 Moulton
4,049,506 A 9/1977 Gilding
(Continued)

FOREIGN PATENT DOCUMENTS

DE 10253841 A1 5/2004
EP 1181256 B1 3/2006
(Continued)

OTHER PUBLICATIONS 12815529.8, "European Application Serial No. 12815529.8, European Extended Search Report mailed Jan. 22, 2015", Southern Illinois University Carbondale, 8 Pages.
201280045439.5, "Chinese Application Serial No. 201280045439.5, First Office Action mailed May 5, 2015", Bakul Champaklal Dave, 19 Pages.
Abrams, et al., "Field and Lab Verification of Hydrophobic Anti-Reflective and Anti-Soiling Coatings on Photovoltaic Glass", Topic 5BV.1.50: Operation of PV Systems and Plants, presented at the 29th European PV Solar Energy Conference and Exhibition (EUPVSEC), Amsterdam, The Netherlands, Sep. 22-26, 2014, 6 pages.
(Continued)

*Primary Examiner* — Lauren R Colgan
(74) *Attorney, Agent, or Firm* — GTC Law Group PC & Affiliates

(57) ABSTRACT

Disclosed herein is a coated glass element including a glass component and a coating adhered to the glass component through siloxane linkages, the coating having at least one of an anti-reflective property, a high abrasion resistance property and a hydrophobic property, wherein the coating comprises a dried gel formed from at least one hydrolyzed alkoxysilane-based sol and at least one hydrolyzed organosilane-based sol.

30 Claims, 16 Drawing Sheets

(51) Int. Cl.
*H01L 31/0216* (2014.01)
*C09D 5/00* (2006.01)
*C09D 5/16* (2006.01)
*C09D 183/08* (2006.01)
*C08G 77/24* (2006.01)
*C03C 17/00* (2006.01)
*H01L 31/0224* (2006.01)

(52) U.S. Cl.
CPC ..... *C03C 2217/94* (2013.01); *C03C 2218/113* (2013.01); *Y10T 428/265* (2015.01); *Y10T 428/31612* (2015.04)

(56) References Cited

U.S. PATENT DOCUMENTS

| | | | |
|---|---|---|---|
| 4,210,699 A | 7/1980 | Olson et al. | |
| 4,246,038 A | 1/1981 | Vaughn et al. | |
| 4,319,983 A | 3/1982 | Yoo | |
| 4,387,960 A | 6/1983 | Tani | |
| 4,535,026 A | 8/1985 | Yoldas et al. | |
| 4,687,707 A | 8/1987 | Matsuo et al. | |
| 4,857,613 A | 8/1989 | Zolk et al. | |
| 4,929,278 A | 5/1990 | Ashley et al. | |
| 4,966,812 A | 10/1990 | Ashley et al. | |
| 5,091,460 A | 2/1992 | Seto et al. | |
| 5,368,892 A * | 11/1994 | Berquier | C03C 17/30 427/299 |
| 5,527,931 A * | 6/1996 | Rich | C04B 41/4922 556/413 |
| 5,580,819 A | 12/1996 | Li et al. | |
| 5,698,266 A | 12/1997 | Floch et al. | |
| 5,851,674 A | 12/1998 | Pellerite et al. | |
| 5,858,462 A | 1/1999 | Yamazaki | |
| 6,054,601 A | 4/2000 | Standke et al. | |
| 6,177,131 B1 | 1/2001 | Glaubitt et al. | |
| 6,183,872 B1 | 2/2001 | Tanaka et al. | |
| 6,277,485 B1 | 8/2001 | Invie et al. | |
| 6,312,152 B2 * | 11/2001 | Dee | 194/217 |
| 6,337,133 B1 * | 1/2002 | Akamatsu | C03C 17/30 428/410 |
| 6,376,064 B1 | 4/2002 | Gasworth et al. | |
| 6,472,073 B1 | 10/2002 | Singh et al. | |
| 6,506,496 B1 | 1/2003 | Frugier et al. | |
| 6,556,228 B1 * | 4/2003 | Camis | G03G 15/04054 347/139 |
| 6,692,832 B2 | 2/2004 | Murphy | |
| 6,768,048 B2 | 7/2004 | Woll et al. | |
| 6,828,381 B1 | 12/2004 | Armbrust et al. | |
| 6,902,767 B2 | 6/2005 | Kelsoe | |
| 6,906,115 B2 | 6/2005 | Hanazawa et al. | |
| 6,942,924 B2 | 9/2005 | He et al. | |
| 6,997,018 B2 | 2/2006 | Sakoske et al. | |
| 7,128,778 B2 | 10/2006 | Thompson | |
| 7,128,944 B2 | 10/2006 | Becker et al. | |
| 7,241,505 B2 | 7/2007 | Glaubitt et al. | |
| 7,345,351 B2 | 3/2008 | Moon et al. | |
| 7,351,449 B2 | 4/2008 | Hunt et al. | |
| 7,575,809 B2 | 8/2009 | Glaubitt et al. | |
| 7,588,823 B2 | 9/2009 | Taylor | |
| 7,635,522 B2 | 12/2009 | Cnossen et al. | |
| 7,642,199 B2 | 1/2010 | Meredith et al. | |
| 7,704,608 B2 | 4/2010 | Thies et al. | |
| 8,217,261 B2 | 7/2012 | Wieting et al. | |
| 8,263,312 B2 | 9/2012 | Fu et al. | |
| 8,304,161 B2 | 11/2012 | Bradford et al. | |
| 8,557,877 B2 | 10/2013 | Mukhopadhyay et al. | |
| 8,668,960 B1 | 3/2014 | Hanumanthu et al. | |
| 8,864,897 B2 | 10/2014 | Nair et al. | |
| 2001/0031811 A1 | 10/2001 | Li et al. | |
| 2002/0090519 A1 | 7/2002 | Kursawe et al. | |
| 2002/0090739 A1 | 7/2002 | Laguitton et al. | |
| 2002/0150765 A1 | 10/2002 | Chang et al. | |
| 2006/0286813 A1 | 12/2006 | Meredith et al. | |
| 2006/0292345 A1 | 12/2006 | Dave et al. | |
| 2007/0116970 A1 * | 5/2007 | Kato | C09D 183/10 428/447 |
| 2007/0148435 A1 | 6/2007 | Meredith et al. | |
| 2007/0184247 A1 | 8/2007 | Simpson et al. | |
| 2007/0264437 A1 | 11/2007 | Zimmermann et al. | |
| 2008/0063859 A1 | 3/2008 | Fath et al. | |
| 2008/0113188 A1 | 5/2008 | Shah et al. | |
| 2008/0248312 A1 | 10/2008 | Thies et al. | |
| 2009/0029145 A1 | 1/2009 | Thies et al. | |
| 2009/0043025 A1 * | 2/2009 | Tsujimoto | C08G 59/306 524/263 |
| 2009/0087665 A1 | 4/2009 | Suzuki et al. | |
| 2009/0151773 A1 | 6/2009 | Hayes et al. | |
| 2009/0191346 A1 | 7/2009 | Thies et al. | |
| 2009/0194165 A1 * | 8/2009 | Murphy | C23C 14/0623 136/260 |
| 2009/0285993 A1 | 11/2009 | Kang et al. | |
| 2010/0015454 A1 * | 1/2010 | Anderson | B32B 17/10174 428/429 |
| 2010/0016502 A1 | 1/2010 | Rentrop et al. | |
| 2010/0101649 A1 * | 4/2010 | Huignard | B32B 17/10036 136/261 |
| 2010/0221557 A1 * | 9/2010 | Higuchi | C08J 7/04 428/447 |
| 2010/0275815 A1 * | 11/2010 | Dave | C03C 17/30 106/287.1 |
| 2011/0003130 A1 | 1/2011 | Marchet et al. | |
| 2011/0151146 A1 | 6/2011 | Okano et al. | |
| 2011/0236835 A1 | 9/2011 | Fu et al. | |
| 2011/0308602 A1 | 12/2011 | Junghänel et al. | |
| 2012/0040179 A1 * | 2/2012 | Dave | C03C 17/30 428/336 |
| 2012/0225215 A1 | 9/2012 | Kalyankar et al. | |
| 2012/0251718 A1 | 10/2012 | Kalyankar et al. | |
| 2013/0034653 A1 | 2/2013 | Kumar et al. | |
| 2013/0095237 A1 | 4/2013 | Kalyankar et al. | |
| 2013/0180580 A1 | 7/2013 | Krasnov et al. | |
| 2013/0186466 A1 | 7/2013 | Hebrink et al. | |
| 2014/0004334 A1 | 1/2014 | Kalyankar | |
| 2014/0011019 A1 | 1/2014 | Mukhopadhyay et al. | |
| 2014/0150850 A1 | 6/2014 | Hwang et al. | |
| 2014/0166092 A1 | 6/2014 | Kozinsky et al. | |
| 2014/0170403 A1 | 6/2014 | Tang et al. | |
| 2014/0261615 A1 | 9/2014 | Nair et al. | |
| 2014/0261673 A1 | 9/2014 | Nair et al. | |
| 2014/0272126 A1 | 9/2014 | Liang et al. | |
| 2015/0037570 A1 | 2/2015 | Brophy et al. | |
| 2016/0002498 A1 | 1/2016 | Maghsoodi et al. | |
| 2016/0013329 A1 | 1/2016 | Brophy et al. | |
| 2016/0032141 A1 | 2/2016 | Maghsoodi et al. | |
| 2016/0032147 A1 | 2/2016 | Maghsoodi et al. | |
| 2016/0083620 A1 | 3/2016 | Maghsoodi et al. | |

FOREIGN PATENT DOCUMENTS

| | | |
|---|---|---|
| EP | 1674891 A1 | 6/2006 |
| JP | 02264074 A | 10/1990 |
| JP | 04085380 A | 3/1992 |
| JP | 09048640 A | 2/1997 |
| JP | 2002053806 A | 2/2002 |
| JP | 2003201443 A | 7/2003 |
| JP | 2005196802 A | 7/2005 |
| KR | 1020140065250 A | 5/2014 |
| WO | 9743224 A1 | 11/1997 |
| WO | 0010934 A1 | 3/2000 |
| WO | 0064830 A1 | 11/2000 |
| WO | 2004044071 A2 | 5/2004 |
| WO | 2004051755 A1 | 6/2004 |
| WO | 2005044554 A2 | 5/2005 |
| WO | 2007068545 A2 | 6/2007 |
| WO | 2008027698 A1 | 3/2008 |
| WO | 2008074823 A1 | 6/2008 |
| WO | 2010127034 A1 | 11/2010 |
| WO | 2013012753 A1 | 1/2013 |
| WO | 2014193513 | 12/2014 |
| WO | 2014193513 A3 | 2/2015 |
| WO | 2016011041 A1 | 1/2016 |

(56) References Cited

FOREIGN PATENT DOCUMENTS

| | | |
|---|---|---|
| WO | 2016011071 A2 | 1/2016 |
| WO | 2016011071 A3 | 3/2016 |
| WO | 2016064494 A2 | 4/2016 |

OTHER PUBLICATIONS

Abrams, et al., "Field Performance Gains of Anti-Soiling & Anti-Reflective Photovoltaic Glass Coating", SNEC 2014—The 8th International Photovoltaic Power Generation Conference & Exhibition, Shanghai, China, May 20-22, 2014, 7 pages.
Aegerter, et al., "Coatings made by Sol-Gel and Chemical Nanotechnology", J. Sol-Gel Sci. Technol., vol. 47, Jun. 5, 2008, pp. 203-236.
Cuddihy, et al., "Antisoiling Technology: Theories of Surface Soiling and Performance of Antisoiling Surface Coatings", JPL Publication 84-72, JPL Document 5101-251, DOE/JPL-1012-102, Jet Propulsion Laboratory, Pasadena, California, Nov. 15, 1984, 38 pages.
Garcia, et al., "Soiling and other optical losses in solar-tracking PV plants in Navarra", Progress in Photovoltaics: Research and Applications, vol. 19, Iss. 2,, Mar. 2011, pp. 211-217.
Hacke, et al., "Characterization of Multicrystalline Silicon Modules with System Bias Voltage Applied in Damp Heat", Presented at the 25th European Photovoltaic Solar Energy, Conference and Exhibition (EUPVSEC), Valencia, Spain, Sep. 6-10, 2010, Conference Paper NREL/CP-5200-49344, Jul. 2011, 8 pages.
Hacke, et al., "System voltage potential-induced degradation mechanisms in PV modules and methods for test", Presented at the 37th IEEE Photovoltaic Specialists Conference (PVSC), Seattle, Washington, Jun. 19-24, 2011, Jul. 2011, 9 pages.
Hacke, et al., "Test-to-Failure of Crystalline Silicon Modules", Presented at the 35th IEEE Photovoltaic Specialists Conference, Honolulu, Hawaii, Jun. 20-25, 2010, Conference Paper NREL/CP-5200-47755, Oct. 2010, 10 pages.
Kimber, et al., "The Effect of Soiling on Large Grid-Connected Photovoltaic Systems in California and the Southwest Region of the United States", Conference Record of the 2006 IEEE 4th World Conference on Photovoltaic Energy Conversion, vol. 2, pp. 2391-2395, May 2006.
Makita, et al., "Sol-Gel Preparation of Silica Films with Controlled Surface Morphology and Their Application to a Low Reflective Glass", Journal of Sol-Gel Science and Technology, vol. 14, 1999, pp. 175-186.
Nocuń, et al., "Sodium diffusion barrier coatings prepared by sol-gel method", Optica Applicata, vol. XXXVIII, No. 1,, 2008, pp. 171-179.
PCT/US2010/032823, "International Preliminary Report on Patentability for International Application Serial No. PCT/US2010/032823 mailed Nov. 10, 2011", 5 pages.
PCT/US2010/032823, "International Search Report and Written Opinion for International Application Serial No. PCT/US2010/032823 mailed Jun. 28, 2010", 7 pages.
PCT/US2012/046791, "International Application Serial No. PCT/US2012/046791, International Preliminary Report on Patentability and Written Opinion mailed Jan. 30, 2014", Southern Illinois University Carbondale et al, 7 Pages.
PCT/US2012/046791, "International Search Report and Written Opinion for International Application Serial No. PCT/US2012/046791 mailed Sep. 21, 2012", 8 pages.
PCT/US2014/022857, "International Application Serial No. PCT/US2014/022857, International Search Report and Written Opinion mailed Dec. 19, 2014", Enki Technology, Inc., 8 Pages.
PH1-2014-500172, "Philippines Application Serial No. 1-2014-500172, Office Action Mailed May 22, 2014", Enki Technology, Inc., 1 Page.

Pingel, et al., "Potential Induced Degradation of solar cells and panels", 35th IEEE Photovoltaic Specialists Conference (PVSC), 2010, 6 pages.
Pop, et al., "A Highly Abrasive-Resistant, Long-Lasting Anti-Reflective Coating for PV Module Glass", 40th IEEE Photovoltaic Specialists Conference, Denver, Colorado, USA, Jun. 8-13, 2014, 5 pages.
Rose, et al., "Mass Production of PV Modules with 18% Total-Area Efficiency and High Energy Delivery Per Peak Watt", Conference Record of the 2006 IEEE 4th World Conference on Photovoltaic Energy Conversion (WCPEC), vol. 2, Waikoloa, HI, May 7-12, 2006, pp. 2018-2023.
San Vicente, et al., "Long-term durability of sol-gel porous coatings for solar glass covers", Thin Solid Films, vol. 517, issue 10, Mar. 31, 2009 (e-version 2008), pp. 3157-3160.
San Vicente, et al., "Surface modification of porous antireflective coatings for solar glass covers", Solar Energy, vol. 85, issue 4, Apr. 2011 (e-version 2010), pp. 676-680.
Schutze, et al., "Laboratory study of potential induced degradation of silicon photovoltaic modules", 37th IEEE Photovoltaic Specialists Conference (PVSC), 2011, 6 pages.
Tatapudi, "Potential Induced Degradation (PID) of Pre-Stressed Photovoltaic Modules: Effect of Glass Surface Conductivity Disruption", Master of Science in Technology Thesis, Arizona State University, Dec. 2012, 110 pages.
Xiu, et al., "Fabrication of Surface Micro- and Nanostructures for Superhydrophobic Surfaces in Elctric and Electronic Applications", In Partial Fulfillment of the Requirements for the Degree Doctor of Philosophy in the School of Chemical and Biomolecular Engineering Georgia Institute of Technology, Dec. 2008, 287 Pages.
Xu, et al., "Comparative study on hydrophobic anti-reflective films from three kinds of methyl-modified silica sols", Journal of Non-Crystalline Solids, vol. 351, 2005, pp. 258-266.
Xu, et al., "Durable solgel antireflective films with high laser-induced damage thresholds for inertial confinement fusion", J. Opt. Soc. Am. B, vol. 22, No. 4, Apr. 2005, pp. 905-912.
Yan, et al., "SiO2 as Barrier Layer for Na Out-Diffusion from Soda-Lime Glass", 35th IEEE Photovoltaic Specialists Conference (PVSC), Jun. 20-25, 2010, Honolulu, HI, 2010, pp. 002519-002521.
U.S. Appl. No. 14/491,259, filed Sep. 19, 2014, Pending.
U.S. Appl. No. 14/799,223, filed Jul. 14, 2015, Pending.
PCT/US2015/040393, filed Jul. 14, 2015, Pending.
U.S. Appl. No. 14/799,479, filed Jul. 14, 2015, Pending.
U.S. Appl. No. 14/799,507, filed Jul. 14, 2015, Pending.
PCT/US2015/040440. filed Jul. 14, 2015, Pending.
"Figures 4a and 4b from U.S. Appl. No. 13/184,568", 2012, 1 Page.
12815529.8, "European Application Serial No. 12815529.8, Examination Notification Art. 94(3) mailed Sep. 4, 2015", Southern Illinois University Carbondale, 5 Pages.
201280045439.5, "Chinese Application Serial No. 201280045439.5, Second Office Action mailed Dec. 8, 2015", Enki Technology, Inc., 10 pages.
2014521679, "Japanese Application Serial No. 2014521679, Office Action mailed Oct. 14, 2015", Bakul Champaklal Dave, 11 Pages.
PCT/US2014/022857, "International Application Serial No. PCT/US2014/022857, International Preliminary Report on Patentability and Written Opinion mailed Sep. 24, 2015", Enki Technology, Inc., 5 Pages.
PCT/US2015/040393, "International Application Serial No. PCT/US2015/040393, International Search Report and Written Opinion mailed Nov. 13, 2015", Enki Technology, Inc., 11 pages.
12815529.8, "European Application Serial No. 12815529.8, Communication Pursuant to Article 94(3) EPC mailed Jan. 22, 2016", Southern Illinois University Carbondale, 6 pages.
PCT/US2015/040440, "International Application Serial No. PCT/US2015/040440 International Search Report and Written Opinion mailed Feb. 5, 2016", Enki Technology, Inc., 17 pages.

* cited by examiner

ANTI-REFLECTIVE AND ANTI-SOILING COATINGS WITH SELF-CLEANING PROPERTIES

CROSS-REFERENCE TO RELATED APPLICATIONS

This application is a continuation of the following U.S. patent application, which is incorporated by reference in its entirety: U.S. application Ser. No. 14/488,923, filed Sep. 17, 2014 (ENKI-0010-U01).

U.S. application Ser. No. 14/488,923 (ENKI-0010-U01) is a continuation-in-part of the following U.S. patent application, which is incorporated by reference in its entirety: U.S. application Ser. No. 13/184,568, filed Jul. 18, 2011, which issued on Oct. 21, 2014 as U.S. Pat. No. 8,864,897 (ENKI-0002-U01).

U.S. application Ser. No. 13/184,568 (ENKI-0002-U01) is a continuation-in-part of U.S. application Ser. No. 12/769,580, filed Apr. 28, 2010 (ENKI-0001-U01), which claims the benefit of U.S. Provisional Application No. 61/174,430, filed Apr. 30, 2009 (ENKI-0001-P01).

The entirety of each of the foregoing applications is incorporated by reference herein.

STATEMENT REGARDING GOVERNMENT FUNDING

This invention was made with government support under Contract DE-EE0006040 awarded by the U.S. Department of Energy. The government has certain rights in the invention.

BACKGROUND

1. Field

The embodiments of the disclosure are directed to coatings and their uses. More particularly, the embodiments of the disclosure are directed to coating compositions that include silane-based precursors that are used to form coatings through a sol-gel process. The resulting coatings are characterized by anti-reflective, abrasion resistant, and anti-soiling properties. The coatings also have extended weatherability to heat and humidity and protection against ambient corrosives. The coatings formed from the compositions described herein have wide application, including, for example, use as coatings on the outer glass of solar cells or panels.

2. Description of Related Art

Anti-reflective coatings are used in a wide variety of commercial applications ranging from sunglasses, windows, car windshields, camera lenses, solar panels, and architectural systems. These coatings minimize the reflections on the surface of the glass as the light rays travel through a discontinuous dielectric gradient. The reflection of light usually results in reduced transmittance of the light across the transparent material. For optical applications, it is important that a majority of incident light passes through the interface for maximum efficiency. In this context, anti-reflective coatings provide a useful benefit in optical applications.

Anti-reflective coatings are normally used in glasses, acrylics, and other transparent materials that serve as windows and glass panels associated with architectural structures or energy generating and saving systems. In building windows, they are used to maximize influx of incident light to maintain proper lighting or natural ambience as well as to minimize distracting reflections from glass surfaces. In energy generating and saving devices, such as solar panels and light collectors, the utility of anti-reflective coatings lies in the enhanced efficiency of these devices due to a greater degree of light transmittance and, therefore, increased energy generation for the same cost.

In order for optical elements to perform optimally, it is necessary that they be free from surface contamination and depositions (e.g., dirt) that may reduce light transmittance and, therefore, performance of the coatings. In particular, for optical elements that are exposed to an outside environment, such as solar panels and building windows, the long term exposure to chemical and physical elements in the environment usually results in deposition of dirt on the surface of the optical element. The dirt may comprise particles of sand, soil, soot, clay, geological mineral particulates, air-borne aerosols, and organic particles such as pollen, cellular debris, biological and plant-based particulate waste matter, and particulate condensates present in the air. Over time, deposition of such dirt significantly reduces the optical transparency of the optical element. As a result, there is considerable expenditure of human and financial resources associated with regular cleaning of such optical elements, such as transparent windows and solar panels.

The deposition of dirt on such optical elements can be classified into two types: physically bound and chemically bound particulate matter. The physically bound particles are loosely held due to weak physical interactions such as physical entanglement, crevice entrapment, and entrapment of particulates within the nanoscale or microscale edges, steps, terraces, balconies, and boundaries on the uneven surface of the optical element, such as a window surface. These particles can be dislodged with moderate energy forces such as wind, air from a mechanical blower, or by means of water flow induced by rain or other artificially generated sources of flowing water such as a water hose or sprayer. On the other hand, chemically bound particles are characterized by the presence of chemical interactions between the particles themselves and between the particulate matter and the optical element itself, such as glass or acrylics (e.g., plexiglass) used, for example, in windows. In these cases, removal of these particles becomes difficult and usually requires the use of physical means such as high pressure water hoses or manual scrubbing or both. Alternatively, chemical means such as the application of harsh solvents, surfactants, or detergents to the optical element to free the dirt particles from the surfaces can be used.

As noted, the dirt on ambiently exposed optical elements, such as windows and solar panels, may be somewhat removed based upon natural cleaning phenomenon such as rain. However, rain water is only effective at removing loosely (physically) held particulate matter and is not able to remove the particulate matter that may be strongly (chemically) bonded to optical element, such as the glass or window surfaces. Furthermore, rain water usually contains dissolved matter that is absorbed from the environment during its descent that can leave a visible film when dried.

As such, all externally exposed optical elements, such as window materials and solar panels in which the optimal transmission of light is important, require some form of routine cleaning efforts associated with their maintenance regimen. In fact, the surfaces of these items are cleaned during fabrication as well as routinely during use. The surfaces of these items, such as solar panels, are usually cleaned with water, detergent, or other industrial cleaners. As a result, anti-reflective coating materials applied to these optical elements need to be able to withstand the use of normal cleaning agents including detergents, acid, bases, solvents, surfactants, and other abrasives to maintain their anti-reflective effect. Abrasion of these coatings over time due to cleaning and the deposition of dirt or other environmental particulate may reduce their performance. Therefore, abrasion resistance is an important consideration for anti-reflective coatings. For example, resistance to abrasion is an important consideration for a coating used in connection with a solar panel, particularly for long term functional performance of the solar panel.

A majority of anti-reflective coatings are based on oxides as preferred materials. Some anti-reflective coatings are made of either a very porous oxide-based coating or, alternatively, are comprised of stacks of different oxides. These oxide materials are chemically reactive with dirt particles by means of hydrogen bonding, electrostatic, and/or covalent interactions depending upon the type of coating material and the dirt particle. Therefore, these oxide based coatings have a natural affinity to bind molecules on their surfaces. Further, highly porous coatings can physically trap dirt nanoparticles in their porous structure. As a result, current anti-reflective coatings are characterized by an intrinsic affinity for physical and/or chemical interactions with dirt nanoparticles and other chemicals in the environment and suffer from severe disadvantages in maintaining a clean surface during their functional lifetime.

Further, one of most common issue frequently associated with anti-reflective coatings is their performance over the entire solar spectrum, particularly with respect to solar panels. While there are several anti-reflective coatings that are only effective in a narrow region of the solar spectrum, for maximum efficiency it is desirable that anti-reflective coatings perform equally well over the entire solar region from 300 nm to 1100 nm.

Consequently, there exists a need in the art for a coating that can provide the combined benefits of anti-reflective properties, such as a coating that can reduce light reflection and scattering from the applicable optical surface; anti-soiling or self-cleaning properties, such as a coating surface that is resistant to binding and adsorption of dirt particles (e.g., resistant to chemical and physical bonding of dirt particles); abrasion resistant properties, such as stability against normal cleaning agents such as detergents, solvents, surfactants, and other chemical and physical abrasives; and UV stability or suitable performance over the entire solar region.

Further, it would be beneficial for such coatings to be mechanically robust by exhibiting strength, abrasion resistance, and hardness sufficient to withstand the impact of physical objects in the environment such as sand, pebbles, leaves, branches, and other naturally occurring objects. It would be beneficial for such coatings to also exhibit mechanical stability such that newly manufactured coatings or films would be less likely to develop cracks and scratches that limit their optimum performance, thereby allowing such coatings to be more effective for a relatively longer term of usage. In addition, it would be beneficial for such coatings to be able to withstand other environmental factors or conditions such as heat and humidity and to be chemically non-interactive or inert with respect to gases and other molecules present in the environment, and non-reactive to light, water, acid, bases, and salts. In other words, it is desirable to provide coatings having a chemical structure that reduces the interaction of the coating with exogenous particles (e.g., dirt) to improve the long term performance of the coating.

It would also be preferable to enable deposition of such coatings onto the optical surface, such as the surface of a window or solar panel surface, using common techniques such as spin-coating; dip-coating; flow-coating; spray-coating; aerosol deposition; ultrasound, heat, or electrical deposition means; micro-deposition techniques such as ink-jet, spay-jet, or xerography; or commercial printing techniques such as silk printing, dot matrix printing, etc.

It would also be preferable to enable drying and curing of such coatings at relatively low temperatures, such as below 150° C. so that the coatings could be applied and dried and cured on substrates to which other temperature sensitive materials had been previously attached, for example a fully assembled solar panel.

SUMMARY OF THE INVENTION

The present disclosure provides coating compositions comprising a silane precursor or combination of silane precursors, a solvent, optionally an acid or base catalyst, and optionally another additive. The coating compositions are hydrolyzed to provide a sol that can be coated on a substrate from which a gel is formed that is subsequently dried and cured to form a coating having a combination of anti-reflective properties, anti-soiling or self-cleaning properties, and abrasion resistance. Accordingly, the anti-reflective coatings provided by the present disclosure are physically, mechanically, structurally, and chemically stable.

In some embodiments, the coating compositions include a combination of sols containing tetraalkoxysilane, organosilane, and organofluorosilane that can be used to form coatings for transparent substrates such as solar panels. In some embodiments, the composition of the coating composition is based upon a precise selection of solvent, pH, solvent to water ratio, and solvent to silane ratio that allows the resulting sol to remain stable for a significant period of time without exhibiting change in its chemical or physical characteristics.

The disclosure also provides methods for applying the coatings of the present disclosure and for using such coatings. In some embodiments, the methods of treating a substrate comprises pre-treatment of the substrate based on combination of chemical treatment, etching, and/or polishing or cleaning steps that enable a uniform spreading of the sol for making a thin film or coating with thickness ranging from 50 nm to 200 nm. Thereafter, in some embodiments, the methods include applying the sol to the substrate and allowing the sol to gel to form the coating with the desired properties. In some embodiments, the application of the sol to the substrate includes drop rolling and/or flow coating that results in uniform deposition of the sol to form an even, uniform and crack-free coating. In some embodiments, the method includes thermally treating the coated articles under specific condition of heat and humidity to form a chemically durable coating that adheres strongly to the substrate without cracking and/or peeling.

One aspect of the disclosure is an article. The article includes a glass and a dried gel coating on at least one surface of the glass, the coating formed from acid-hydrolyzed alkoxysilane, acid-hydrolyzed organosilane and an acid-hydrolyzed organofluorosilane, wherein the coated glass has at least one of an anti-reflective property, a high abrasion resistance property, a hydrophobic property, an oleophobic property and an anti-soiling property, wherein fluorine is present throughout a thickness of the coating.

Another aspect of the disclosure is a solar module coating. The coating includes a persistent hydrophobic and oleophobic property, an anti-reflective property that increases solar module efficiency, and an anti-soiling property that reduces energy generation losses due to soiling and reduces the frequency of washing when compared to equivalent solar modules without a coating, wherein the solar module coating is selected to reduce the levelized cost of energy of a solar energy generating system.

In some embodiments, the disclosure provides for the use of the coating compositions as an efficiency enhancement aid in architectural windows in building and houses by the provision of anti-reflection benefits and/or by the provision of anti-soiling benefits to augment the anti-reflection benefits. In other embodiments, the disclosure provides for the use of the coating compositions as an efficiency enhancement aid in treatment of transparent surfaces (that require regular cleaning) to make them self-cleaning.

In some embodiments, the disclosure provides a coated glass-based article suitable for use as outer cover of a solar module assembly that is anti-reflective, hydrophobic and/or oleophobic and exhibits resistance to abrasion, uv light, heat, humidity, corrosives such as acids, bases, salts, and cleaning agents such as detergents, surfactants, solvents and other abrasives.

DETAILED DESCRIPTION

Figure 1:
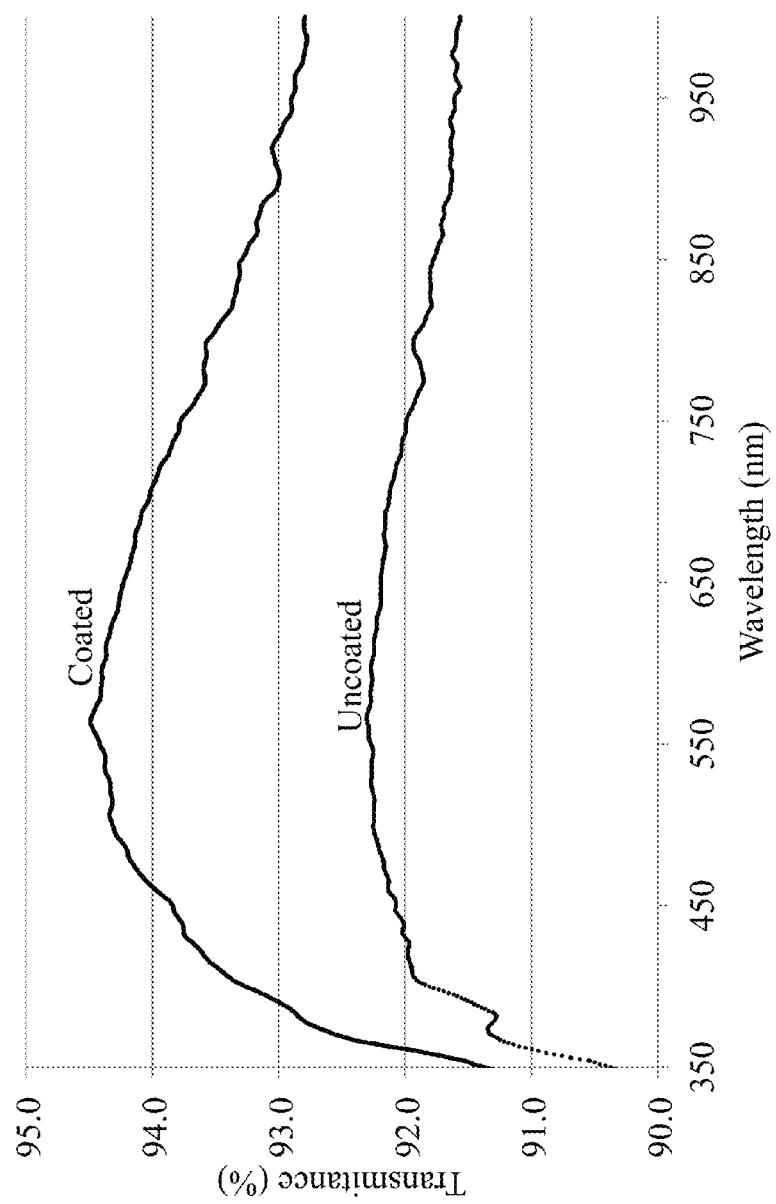
FIG. 1 illustrates the UV-vis transmittance spectra showing maximum transmittance enhancement of 2% with coatings on glass slides made from composition given in Example 1.

Various embodiments of the disclosure are described below in conjunction with the Figures; however, this description should not be viewed as limiting the scope of the present disclosure. Rather, it should be considered as exemplary of various embodiments that fall within the scope of the present disclosure as defined by the claims. Further, it should also be appreciated that references to "the disclosure" or "the present disclosure" should not be construed as meaning that the description is directed to only one embodiment or that every embodiment must contain a given feature described in connection with a particular embodiment or described in connection with the use of such phrases. In fact, various embodiments with common and differing features are described herein.

The present disclosure is generally directed to coatings that provide a combination of benefits including anti-reflective properties, anti-soiling properties, self-cleaning properties and manufacturing flexibility as well as other benefits. Accordingly, the coatings of the present disclosure may be used on substrates, such as transparent substrates, to increase the light transmittance through the substrates. In particular, the coatings may be used on transparent substrates such as glass or the front cover glass of solar panels.

The present disclosure is particularly well suited for use with glass used in solar energy generation ("solar glass"). It should be understood that solar energy generation includes solar photovoltaic and solar thermal, wherein solar insolation is used to produce heat either as an end-point or as an intermediate step to generate electricity. Furthermore it should be understood that solar glass may be used in any application where maximal transmission of solar energy through the glass is desired such as for example in greenhouses. Typically solar glass is high transmission low iron glass. It may be either float glass, that is, flat glass sheets formed on a molten tin bath or rolled glass wherein the flat glass is formed by the action of rollers. Float glass is often characterized by the presence of tin contamination on the bottom ("tin side") of the glass. Rolled glass is typically textured on one side to improve its performance in solar panels. The present disclosure may also be applied to glass surfaces used as mirrors in solar energy generation such as parabolic trough systems or in heliostats. It may also be used to coat various glass lenses such as Fresnel lenses used in solar thermal generation. Additionally, solar glass may have various coatings applied. For example a common coating is a transparent conduction oxide (CTO) such as indium tin oxide (ITO) or fluorine doped tin oxide on one side of the glass. This coating is used to provide the front electrode for many thin film solar panel technologies. Other coatings may be present such as coatings to seal in alkali ions such as $Na^+$ and $Ca^+$ that are used in the manufacturer of the glass but that cause long term reliability problems when leached out by water. Other techniques to solve this problem are to deplete these ions in thin layers of the glass surface. Solar glass may also be coated with a reflective surface to form a mirror. Solar glass may be tempered or untempered. Tempered glass is significantly stronger and solar panels manufactured using it typically only need one sheet of glass. Solar panels manufactured with untempered front glass typically need a back sheet of tempered glass to meet strength and safety requirements. Many thin-film solar photovoltaic technologies also use the front glass as a substrate upon which they deposit materials that comprise the solar cell. The processes used during the manufacturer of the solar cell may adversely affect the properties of any existing coatings on the glass or existing coatings may interfere with the solar cell manufacturing process. The present disclosure is completely tolerant of type of glass selected by the solar panel manufacturer. It works equally well on float or rolled glass. It is not adversely affected by the presence tin contamination on float glass.

One critical issue for solar panel manufacturers that use CTO or ITO (or similar) coated glass is tempering. It is very difficult to achieve low-cost, high quality CTO or ITO coated tempered glass. Therefore solar panel manufacturers that require CTO or ITO coated glass use untempered glass, necessitating the use of a second sheet of tempered glass on the back side of the solar panel. Additionally even if suitable CTO or ITO coated tempered glass was available some thin-film solar manufacturing processes heat the glass during manufacturer to the extent that the temper is lost. All existing anti-reflective glass on the market is tempered, because the anti-reflective coating is actually formed during the tempering process. Tempering is the process by which the glass is heated to 600° C. to 700° C. then quickly cooled. This high tempering temperature effectively sinters the anti-reflective coating providing it with its final mechanical strength. Thus solar panel manufacturers that cannot use tempered glass typically cannot use anti-reflective glass. The present disclosure may be applied and cured at a low temperature of between 20° C. and 200° C. and between 20° C. and 130° C. and further between 80° C. and 200° C. This low temperature facilitates the coating of completed solar panels without damage to the panel. Thus it is an anti-reflective solution for users of untempered solar glass.

The low temperature curing of the present disclosure also provides substantial benefits to solar panel manufacturers beyond enabling untempered anti-reflective glass. By making possible the coating of the glass without the need for the tempering step, solar panel manufacturers are enabled to apply their own anti-reflective coating. Currently the requirement for a large tempering oven means that solar panels manufacturers are restricted to buying anti-reflective glass from glass manufacturers. This means that they must maintain inventory of both anti-reflective coated and non-coated glass. As these cannot be used interchangeably inventory flexibility is reduced necessitating keeping larger amounts of inventory on hand. The ability for the solar panel manufacturer to apply their own coating means that they can just hold a smaller inventory of non-coated glass and then apply the anti-reflective coating to that as needed.

In addition, existing anti-reflective coatings are prone to scratching during the solar panel manufacturing process. Typically solar panel manufacturers must use a plastic or paper sheet to protect the coating. As the coating of the present disclosure can be applied to fully manufactured solar panels, it can be applied at the end of the manufacturing process thus removing the need for the protection sheet and the opportunity for damage to the coating during manufacture.

Existing anti-reflective coatings from different manufacturers tend to have subtle color, texture and optical differences. This presents problems to solar panel manufacturers who desire their products to have a completely consistent cosmetic finish. If they manufacturer large numbers of solar panels it is almost inevitable that they will have to order anti-reflective glass from different suppliers causing slight differences in the appearance of the final products. However, the coating of the present disclosure enables solar panel manufacturers to apply their own coating and so enables cosmetic consistency over an unlimited number of solar panels.

In addition, to their anti-reflective properties, the coatings described herein exhibit anti-soiling and/or self-cleaning properties, as they are resistant to the adhesion of dirt and promote the removal of any adhered dirt by the action of water. More specifically, the coatings described herein are characterized by extremely fine porosity that minimizes the deposition of dirt by physical means. Further, these coatings are characterized by a low energy surface that resists chemical and physical interactions and makes it easy to dislodge the particles, thereby making the surfaces essentially anti-soiling. The reduced physical and/or chemical interactions with the environment, such as dirt, make the exposed surface of these coating less susceptible to binding of dirt and also make it easier to clean with a minimal expenditure of force or energy.

Typically in order to completely clean ordinary glass a mechanical action for example brushes or high pressure jet is required to dislodge dirt that is strongly adhered to the surface. However the coating of the present disclosure presents a surface such that dirt is much more attracted to water then to the surface. Thus in the presence of water any dirt resting on the surface is efficiently removed without the need for mechanical action. This means that coated glass will achieve a high level of cleanliness in the presence of natural or artificial rain without human or mechanical intervention. In addition, the amount of water required to clean the glass is substantially reduced. This is of special significance given that the most effective locations for solar energy generation tend to be sunny warm and arid. Thus water is a particularly expensive and scarce resource in the very locations that solar energy is most effective.

The present disclosure enables a significant reduction in the Levelized Cost of Energy (LCOE) to the operator of a solar energy generating system. First, the anti-reflective property increases the efficiency of the solar panels. Increased efficiency enables a reduction of cost in the Balance Of System (BOS) costs in construction of the solar energy generation system. Thus for a given size of system the capital costs and construction labor costs are lower. Second, the anti-soiling property increases the energy output of the solar panels by reducing the losses due to soiling. Third the Operating and Maintenance (O&M) costs are reduced because fewer or no washings are needed eliminating labor and water cost associated with washing.

The coatings described herein also contain water and oil resistant hydro/fluorocarbon groups that make them chemically non-reactive and non-interacting. When used in combination with a glass substrate, the coatings bind to the glass surface using siloxane linkages that make them adhere strongly and makes them strong, durable, and abrasion and scratch resistant. In summary, these coatings are physically and chemically nonreactive, mechanically and structurally stable, hydrophobic, oleophobic, and stable across the UV spectrum. Accordingly, it should be appreciated that the coatings described herein have particular application to transparent substrates that are exposed to the environment, such as exterior windows and the front cover glass of solar panels.

Generally, the coatings described herein are prepared by a sol-gel process. The starting composition, referred to as a "coating mixture" or "coating composition," includes a silane precursor or a combination of silane precursors that when hydrolyzed and condensed forms a particulate suspension of particles in a liquid sol. This sol can be coated onto a substrate using coating techniques known in the art, gelled to form a gel, and dried to form a hard layer or coating having the properties noted above. The process of curing the dried gel further hardens it.

Generally, the resulting properties of the coating described above are provided by using a particular combination of components in the formation of the final coating. In particular, the selection of a particular silane precursor or mixture of silane precursors in combination with other components in the coating mixture is important in providing a coating with the desired properties. For example, in some embodiments, the coatings are made from a mixture of silane precursors including alkoxysilane, organosilane, and organofluorosilane. In some embodiments, separate coating mixtures or mixtures of silane precursors can be used to form separate sols that may then be combined to form a final sol that is applied to a substrate to be coated. Further, a single sol, or separately prepared sols that are combined together, may be combined with another silane precursor to form a final sol that is applied to a substrate to be coated.

It should be appreciated that the coating mixture may include other components in addition to any silane precursors. For example, the silane precursors may be mixed with water or a solvent mixed with water, an acid or base catalyst, and one or more composition modifying additives to impart, provide, modulate, and/or regulate the intrinsic structures, properties, function, and performance of the resulting coatings. The composition modifying additives may include particle size modifying additives, cross-linking additives, and surface modifying additives. Each of these components in the coating mixture is described in more detail below.

It should be appreciated that long term sol stability—as defined by the retention of liquid state without gelation or precipitation—is important in practical applications. Accordingly, the sols provided by the present disclosure are chemically and physically stable under ambient storage conditions for periods ranging from about 3 months to about 6 months. In some embodiments, the sol is stable for periods ranging from about 6 months to about 9 months when stored at 4° C. The stability of the sol is due to several factors including the specific combination of the silane precursors, control of the pH of the sol, selection of a solvent with a balance of hydrogen bonding, polar, and nonpolar groups, balance of the solvent to water ratio in the coating mixture, and balance of the silane(s) to solvent ratio, each of which is described in more detail below.

Each of the specific components used in the coating mixture will now be described. As noted, a silane precursor or a combination of silane precursors is used in the coating mixture to generate the coatings of the present disclosure. The silane precursor used to make the coating may be selected based upon the properties desired to be imparted to the resulting coating. In some embodiments, the silane precursor is selected based upon its tendency to adhere to glass due to formation of strong Si—O—Si bonds between the surface of the glass and the components of the coating composition.

For example, tetraalkoxysilanes when hydrolyzed form an extensively cross-linked structure due to the formation of four Si—O—Si linkages around each silicon atom. These structures are characterized by mechanical stability and abrasion resistance. To impart hydrophobicity to the ultimate coating, organically-modified silanes (such as methyltrimethoxysilane) can be used in addition to the tetraalkoxysilane. Further, to impart oleophobicity and anti-soiling characteristics, organofluorosilanes can be used in addition to the tetralkoxysilane.

In some embodiments, the silane precursor can be alkyltrialkoxysilane, tetraalkoxysilane, an organosilane, an organofluorosilane, or a combination of any one or more of these. The alkyl group for alkyltrialkoxysilane can be methyl, ethyl, or propyl. The tetraalkoxysilane is of the type $(OR)_4Si$ where R=H, methyl, ethyl, isopropyl, or t-butyl. The tetraalkoxysilane can be a methoxy, ethoxy, or isopropoxy or t-butoxy analog. The organosilane is of the type $(OR)_3Si$—R' where R=H, methyl, ethyl, isopropyl, or t-butyl, and R'=methyl, ethyl, or propyl. The organosilane precursor methyltrimethoxysilane can be substituted with triethoxy or tri-isopropoxy derivatives. The organofluorosilane is of the type $(OR)_3Si$-Rf' where R=H, methyl, ethyl, isopropyl, or t-butyl, and Rf'=3,3,3-trifluoropropyl, or tridecafluoro-1,1,2,2-tetrahydrooctyl. The organofluorosilane precursor can be (3,3,3-trifluoropropyl)trimethoxysilane or (tridecafluoro-1,1,2,2-tetrahydrooctyl)trimethoxysilane.

In other embodiments, the coating mixture may comprise organosilica monomers, oligomers, particles, polymers, and/or gels of organosilicate materials made from a single component or mixtures of starting materials having the general formula $(X)_nSi(R)_{4-n}$ and/or $(X)_nSi$—$(R)_{4-n}$—$Si(X)_n$ where X comprises halides, alkoxides, carboxylates, phosphates, sulfates, hydroxides, and/or oxides; n=1, 2, or 3; and R is an alkyl, alkenyl, alkynyl, phenyl, or benzenyl hydrocarbon and/or fluorocarbon chain with 1-20 carbon atoms and a solvent to dissolve or disperse the organosilane.

As noted, in some embodiments, combinations of silane precursors can be used in the coating mixture. The ratio of these silane precursors can be varied independently to fine tune and modify the overall characteristics of the ultimate coating. As such, the stoichiometric ratio of the silane precursors is important for the stability of the sol made from these precursors, as well as for the function and performance of films and coatings made from these sols. For example, the relative ratio of each of these precursors is important to form a stable cross-linked network for mechanical stability and abrasion resistance.

In some embodiments three silane precursors are used. In some embodiments, the three silane precursors used may include an alkoxysilane, an organosilane, and an organofluorosilane. In some embodiments, the alkoxysilane may be alkyltrialkoxysilane or tetraalkoxysilane. The alkyl group for alkyltrialkoxysilane can be methyl, ethyl, or propyl. The tetraalkoxysilane is of the type $(OR)_4Si$ where R=H, methyl, ethyl, isopropyl, or t-butyl. The tetraalkoxysilane can be methoxy, ethoxy, or isopropoxy or t-butoxy analogs. The organosilane may be of the type $(OR)_3Si$—R' where R=H, methyl, ethyl, isopropyl, or t-butyl, and R'=methyl, ethyl, or propyl. The organosilane precursor methyltrimethoxysilane can be substituted with triethoxy or tri-isopropoxy derivatives. The organofluorosilane may be of the type $(OR)_3Si$-Rf' where R=H, methyl, ethyl, isopropyl, or t-butyl, and Rf'=3, 3,3-trifluoropropyl, or tridecafluoro-1,1,2,2-tetrahydrooctyl. The organofluorosilane precursor can be (3,3,3-trifluoropropyl)trimethoxysilane or (tridecafluoro-1,1,2,2-tetrahydrooctyl)trimethoxysilane. In some embodiments, the three silane precursors used may include tetramethoxysilane or tetraethoxysilane (as the tetraalkoxysilane), methyltrimethoxysilane (as the organosilane), and trifluoropropyltrimethoxysilane or tridecafluoro-1,1,2,2-tetrahydrooctyl)trimethoxysilane (as the organofluorosilane). In some embodiments, the total concentration of all of the silane precursors may be from about 1% by weight to about 10% by weight. In some embodiments, the total concentration of all of the silane precursors may be from about 1% by weight to about 4% by weight.

Aside from the total concentration of all of the silane precursors used, the relative amount of each is also important. For example, in the embodiment with three silane precursors, the relative amounts of each that are added to the coating mixture is based upon several factors, including visual sol homogeneity in the coating mixture, uniformity of the film or coating once deposited on the substrate, and the desired abrasion resistance of the coating. More specifically, the relative amounts of each of the three silanes are adjusted to fine tune sol homogeneity, adjust film or coating uniformity, and to control abrasion resistance of the final coating. It should be appreciated that the relative amounts of the silanes used are determined regardless of whether the silane precursors are added to the same coating mixture or whether separate coating mixtures are used to generate separate sols that are then combined to form a final sol that is applied to a given substrate. In other words, the relative amounts of the silane precursors is determined based upon the amount of each silane precursor present in the final sol that will be applied to a given substrate. Regarding sol homogeneity, if three silane precursors are used, each would be hydrolyzed in a solvent medium to form a sol. However, an alkoxysilane such as tetraalkoxysilane is polar and hydrophilic while the organosilane and the organofluorosilane are hydrophobic. As a result, they exhibit differential interaction with each other and with the solvent matrix. High amounts of the organofunctional (organofunctional refers to any trialkyloxysilane with an R group which includes both organo and organofluorosilanes) silanes lead to phase separation and aggregation while lower amounts of organofunctional silanes leads to films with poor anti-reflective and anti-soiling characteristics. Therefore, using the appropriate relative amounts of each of the silane precursors is essential for the desired function and application of the coating mixture on a substrate made from the sol.

Regarding film or coating uniformity, the final sol is applied to a substrate followed by gelation and evaporation of the solvent to form a silica-based coating. Due to their differential interactions with the solvent matrix, the particles made from the different silane precursors differ in their solubility. High amounts of the organofunctionalized silanes (organosilane plus organofluorosilane) lead to development of patchy opaque films due to their limited solubility and phase separation during solvent evaporation. On the other hand, high amounts of tetralkoxysilanes lead to formation of films that do not exhibit sufficient anti-reflective or anti-soiling characteristics. Regarding abrasion resistance, the organosilanes and organofluorosilanes each are capable of forming three Si—O—Si linkages, while the tetraalkoxysilanes can form four Si—O—Si linkages. Therefore, the relative ratio of each of these precursors is important in forming a stable cross-linked network for mechanical stability and abrasion resistance. High amounts of the organofunctionalized silanes (organosilane plus organofluorosilane) in the films result in films that are not sufficiently mechanically stable and that lack sufficient abrasion resistance.

In some embodiments, the relative weight percent ratio of the alkoxysilane, such as tetraalkoxysilane, to the total amount of functionalized silanes (organosilane plus organofluorosilane) lies in the range of about 0.2 to about 2. In some embodiments, this ratio is in the range of about 0.2 to about 1, and in some embodiments, it is in the range of about 0.5 to about 1.

Similarly, the relative ratio of organosilane to organofluorosilane is important in obtaining a stable sol that can spread evenly on the substrate and that does not result in the precipitation or aggregation that may reduce optical transmission through the coating, for example, if used in connection with a solar panel cover. The relative amounts of organosilane and organofluorosilane also determine the hydrophobicity and anti-soiling characteristics. The structural similarities of these two precursors as well as their relative solvation and their intermolecular interactions control their interactions with each other relative to any solvent used in the coating mixture as described below. For example, the chain lengths of the organosilane and fluorosilane are important in determining the ratio of these components. In general, if the side chains on these precursors get too big, then a high amount of these precursors would cause opaque films. Therefore, for precursors with a large R group on the organosilane, its amount would need to be reduced relative to fluorosilane and alkoxysilane. The same holds true for fluorosilane as well. In some embodiments, the relative weight percent ratio of organosilane to organofluorosilane is in the range of about 0.5 to about 1.5. In some embodiments, this ratio is in the range of about 0.75 to about 1.25, and in some embodiments it is in the range of about 0.5 to about 1. Depending upon the use of the ultimately formed coating, in some embodiments, the amount of organosilane or mixture of organosilanes can vary typically from about 0.1% to about 90%, from about 10% to about 65%, and from about 10% to about 25%, by weight of the coating composition or mixture. Examples of organoflurosilanes that can be used include tridecafluoro-1,1,2,2-tetrahydrooctyl)triethoxysilane; tridecafluoro-1,1,2,2-tetrahydrooctyl)dimethylchlorosilane; 3,3,3-trifluoropropyl)trimethoxysilane; 3,3,3-trifluoropropyl)trichlorosilane; and 3,3,3-trifluoropropyl)methyldimethoxysilane; Examples of organosilanes that can be used include methyltrichlorosilane, methyltrimethoxysilane, phenylmethyldiethoxysilane, dimethyldimethoxysilane, and n-propylmethyldichlorosilane. It should be appreciated that the foregoing fluorosilanes and organosilanes may be used alone or in any combination.

As noted, in some embodiments, a solvent may be used in the coating mixture with the silane precursor or combination of silane precursors described above. For example, a solvent may be used in a coating mixture that is used to form a single sol, or a solvent may be used in connection with the formation of separate sols that may be combined to form a final sol for coating a given substrate.

Generally, the solvent is an organic solvent that is in a mixture with water. The nature and amount of the solvent along with the solvent/water ratio and the solvent/silane precursor ratio used in the coating mixture is important in the stability of the sol, as well as in imparting the specific function and performance of the coatings made from the sol containing the hydrolyzed silane precursors. The choice of solvent also affects the viscosity of the sol or spreadability of the sol on the substrate to be coated, as well as the intermolecular interactions of the sol particles and their interactions with the substrate surface to be coated. In addition to providing a matrix for carrying out the sol-gel reaction, the solvent also influences the reaction kinetics of the sol formation steps. Each of these effects on the selection of a solvent and the amount of solvent to be used is described in more detail below.

One factor is the effect of the solvent on hydrolysis and condensation of the silane precursors. In the sol-gel process the silanes are hydrolyzed to silanols that further condense to form siloxane linkages. The particle sizes and the consequent viscosity of the sol depend upon the number of particles and the state of their aggregation in the sol. A solvent that exhibits strong hydrogen bonding and has hydrophilic properties can stabilize individual sol particles to make the sol less viscous and more stable for a longer period of time. A less viscous sol can form thin films on the order of 50-200 nm that are beneficial in providing a coating that provides an anti-reflective effect.

Another factor is the effect of the boiling point and rate of evaporation of the solvent on formation of a uniform film on the substrate from the sol. Solvents with relatively low boiling points and, therefore, having an appreciable rate of evaporation are more desirable in forming a uniform film from the coating mixture or sol. As the solvent evaporates, the silicate particles come closer together and form a network. If the solvent evaporates too rapidly the films may not be uniform. Similarly, a solvent with high boiling point does not evaporate at an appreciable rate under ambient conditions, thereby leading to formation of less desirable opaque films with larger particles.

The solvent also affects the overall spreadability of the sol during the application of the sol on the substrate since the solvent affects the surface energy of the sol. Solvents with lower surface tension enable more even spreading of the sol onto the substrate. Accordingly, in some embodiments, the solvent provides a balance of both hydrophobic and hydrophilic groups to stabilize the sol and to provide for an optimum sol viscosity. For example, alcohols with a moderate chain length of 3-6 carbon atoms are particularly advantageous in lowering the surface tension in the sol.

Another factor is the effect of hydrogen bonding and other intermolecular interactions on the stability of the sol. Solvents that can participate in hydrogen bonding interactions stabilize the sol particles by preventing aggregation and precipitation when the sol is deposited onto a substrate. Solvents containing hydrogen bond donor —OH functional groups, such as alcohols and glycols, along with solvents containing hydrogen bond acceptor R—O—R linkages, such as ethers, are particularly advantageous in preparation of stable sols.

Another factor is the effect of a solvent's toxicity, volatility, and flammability. The toxicity and flammability of the solvent can be a concern in the long term storage and transportation of the sol. Therefore, solvents with low toxicity, volatility, and flammability are preferred. Alcohols, glycols, and glycol ethers are particularly advantageous in this regard.

Considering the above factors in the selection of a solvent, in some embodiments, organic solvents that may be used are ones that contain hydrogen bond donor groups, such as alcohols and glycols with —OH groups, and hydrogen bond acceptor groups, such esters (—COOR), ethers (R—O—R), aldehydes (RCHO), and ketones ($R_2C=O$). Another group of solvents that may be used include glycol ethers and glycol ether esters. These solvents provide a balance of the factors outlined above for stability, viscosity, and spreadability of the sol. In some embodiments, the solvent that may be used in the coating mixture includes methanol, ethanol, 1-propanol, 2-propanol (isopropanol), n-butanol, isobutanol, tert-butanol, pentanol, hexanol, cyclohexanol, ethylene glycol, propylene glycol, ethylene glycol monomethyl ether, ethylene glycol dimethyl ether, propylene glycol monomethyl ether, diglyme, acetone, methyl ethyl ketone (butanone), pantanones, methyl t-butyl ether (MTBE), ethyl t-butyl ether (ETBE), acetaldehyde, propionaldehyde, ethyl acetate, methyl acetate, ethyl lactate, and any combination of any of the foregoing. In other embodiments, the organic solvent may be a ketone. In other embodiments, the solvent may be acetone, ethanol, propanol, isopropanol, butanol, t-butanol, etc. It should be appreciated that the foregoing solvents may be used alone or in any combination.

As noted, the solvent may be used in combination with water. The relative ratio of the solvent to water is important to obtain the desired particle sizes of the sol, which, in turn determines the viscosity of the sol and the resulting thickness of the films formed from the sol once applied to a substrate. As noted above, the thickness of the film is important in providing a coating having suitable anti-reflective properties.

In addition, the relative amount of solvent to water and the sol composition play a key role in stabilizing sol particles so that the particles remain effectively suspended in the solvent matrix without aggregation. Specifically, a balance of hydrophobic and hydrophilic groups is necessary to provide a sol that is stable for extended durations, which in some embodiments may be more than four months, such that the sol does not exhibit large changes in its properties and can still be spread evenly on the substrate, such as a glass surface. This stability is also important in enabling the proper spreading of the sol during its application to a substrate.

Essentially, the solvent to water ratio dictates the balance of hydrophobic and hydrophilic sites in the matrix of the sol and the solvent. Hydrolysis of silane precursors forms hydroxylated particles containing silanol groups. These silanol groups are effectively solubilized by a hydrophilic solvent that provides hydrogen bonding and may reduce cross-linking resulting from condensation reactions. Condensation of these silanol groups to form non-polar Si—O—Si linkages results in cross-linking of the particles, and, due to a reduction in surface hydroxyl groups, the cross-linked structures are energetically favored in a medium that is more hydrophobic. Similarly, the condensation reaction causes the release of water molecule, which is retarded in a medium with high water content. Conversely, a medium with high water content favors hydrolysis of silane precursors to form hydrolyzed sol particles that can combine to form a precipitate. Therefore, the solvent to water ratio is important to form a stable sol.

In particular, the solvent to water ratio plays a significant role in solubilization of the sol particles containing, for example, those generated from silane, organosilane, and organofluorosilane precursors. The nature of the silane precursors dictates a range of functional groups on the surface of sol particles that range from hydrophilic and hydrogen bond donating Si—OH groups to polar and hydrogen bond accepting Si—O—Si groups to nonpolar and hydrophobic organo and fluoroalkyl groups. The solubility and interparticle interactions depend strongly upon the composition of the solvent matrix especially, as noted, the hydrophobic and hydrophilic balance of the solvent matrix.

Accordingly, in some embodiments, the solvent to water weight percent ratio in the coating mixture that has been found to be most advantageous to the stability and spreadability of the sol is in the range of about 5 to about 20. In some embodiments, the solvent to water weight percent ratio is in the range of about 6 to about 12, and in some embodiments it is in the range of about 7 to about 10.

The ratio of the combined weight percent of solvent, including in this case the water as well, (i.e., organic solvent(s) plus water) to that of the combined weight percent of the silane precursor (i.e., the total of all silane precursors used in the coating mixture if more than one silane precursor is used, regardless of whether the silane precursors are added together to form one sol or whether separate sols are formed that are then combined) plays an important role in the long term stability and functional effectiveness of the coatings made from the coating mixtures. Specifically, this ratio can affect several aspects of the sol, including the sol particle size, viscosity, and stability.

The solvent is used to solubilize the silane precursors as well as to effectively disperse the sol particles. A reaction medium that contains a high amount of silane precursor has a high effective concentration of silanes that accelerate the hydrolysis reaction to form smaller particles, while a reaction medium containing a lower concentration of silane precursor enables formation of larger particles in the sol. Sols containing very small particles, such as particles less than 10 nm in size, result in transparent films; however, they may not exhibit any anti-reflective effects. Sols containing larger particles, such as particles larger than 100 nm in size, produce films that tend to be semi-transparent or opaque. Therefore, in some embodiments, sol particles having a size in the range of 10-50 nm are desired.

The relative ratio of solvent to silane also affects viscosity and surface tension of the sol. Highly viscous sols with a smaller solvent to silane precursor ratio can form coatings that are too thick, while very low viscosity sols with a very high solvent to silane precursor ratio results in patchy films and coatings. Therefore, the relative amount of solvent to silane precursors in the sol is important in maintaining proper consistency of the sol and to provide a sufficient mass of silane to form films and coatings with desired thicknesses. In some embodiments, the ratio of solvent to silane precursor is controlled to produce coatings having a thickness of about 60 nm to about 150 nm, which is important to provide an anti-reflective effect.

The relative ratio of solvent to silane precursor is also important in controlling the isolation and separation of sol particles to prevent inter-particle aggregation and agglomeration. At high ratios of solvent to silane precursor (i.e. low concentrations of silane precursor relative to the solvent) the particles are effectively dispersed by the solvent matrix, which keeps them separate and reduces or prevents aggregations. However, the films made from such sols may lack the appropriate thickness to impart useful functional benefits of anti-reflection, anti-soiling, and abrasion resistance. At low ratios of solvent to silane precursor (i.e., high concentration of silanes relative to solvent), the particles are not effectively solubilized and suspended in the solvent matrix resulting in aggregation and precipitation. Coatings made from these sols are opaque or semi-opaque and generally may not be suitable for use as anti-reflective coatings.

Therefore, it should be appreciated that a precise balance of solvent to silane precursor is important for the stability of the sol, as well as the function and performance of the coatings made from sols. In some embodiments, this effective weight percent ratio of total solvent (i.e., water plus organic solvent) to total silane precursors is in the range of about 25 to about 125. In some embodiments, this ratio is in the range of about 40 to about 99, and in some embodiments, this ratio is in the range of about 50 to about 75. The range for this ratio applies to each coating mixture used to form a sol that may be combined to form the final sol that is applied to a given substrate.

In light of the above considerations and ratios, the amount of solvent, including in this case the water as well, (i.e., organic solvent(s) plus water) in the overall coating mixture from which the sol is formed can vary from about 50% to about 90% by weight. In some embodiments, the amount of solvent in this mixture may be from about 80% to about 90% by weight. In one embodiment, a mixture of silane precursors including a tetraalkoxysilane, an organosilane, and an organofluorosilane may be used with isopropanol as the organic solvent in water. In this case, the amount of isopropanol and water may be from about 80% to about 90% by weight. In one embodiment, a mixture of silane precursors including tetramethoxysilane or tetraethoxysilane, methyltrimethoxysilane, and trifluoropropyltrimethoxysilane may be used with isopropanol as the organic solvent in water, the amount of solvent may be 86.4% by weight. The range for this ratio also applies to each coating mixture used to form a sol that may be combined to form the final sol that is applied to a given substrate.

The silane precursor(s) and solvent may also be mixed with an acid or a base as a catalyst to accelerate hydrolysis of the silane precursors. The nature and amount of the acid or base used is important for the stability of the sol as well as function and performance of the coatings made from the sol containing hydrolyzed silane precursors.

When acids are used as catalysts, they can be either a weak acid or a strong acid. They can also be organic acids or inorganic acids. When bases are used as catalysts, they can be either a weak base or a strong base. Similarly, they can also be organic bases or inorganic bases. Acids and bases persist in the sol after the reactions. Examples of strong acids include hydrochloric acid and nitric acid. Examples of weak acids include acetic acid, trifluoromethanesulphonic acid, and oxalic acid. Examples of strong bases include potassium hydroxide, sodium hydroxide, and aqueous ammonia. Examples of weak bases include pyridine, tetraethylammonium hydroxide, and benzyltriethylammonium hydroxide.

Since the acid or base catalyst persists in the sol, their concentration in the medium controls the final pH of the system. For maximum stability of the sol, the pH of the final sol should be controlled to prevent aggregation and precipitation, since the sol particles otherwise have a tendency to aggregate and from viscous gels or precipitates. Similarly, the pH of the sol has been determined to be important in maintaining a proper range of pH for long term sol stability. At low pH the silane particles are positively charged and, therefore, can stay separated due to inter-particle electrostatic repulsions. At high pH, there is a tendency to form anionic silicates that do not form a network.

Two distinct regions of pH stability have been identified that enhance the long term stability and durability of the sol. With acid catalysts, in some embodiments, the effective pH is in the range of about 1 to about 4. In some embodiments, this effective pH is in the range of about 2 to about 4, and in some embodiments, this effective pH is in the range of about 2.5 to about 3.5. With base catalysts, in some embodiments, the effective pH is in the range of about 7 to about 10. In some embodiments, this effective pH is in the range of about 7 to about 9, and in some embodiments, this effective pH is in the range of about 7.5 to about 8.5.

In some embodiments, depending upon the application of the sol, the amount of the catalyst can vary from 0.001% to about 2%, from about 0.1% to about 1%, and from about 0.01% to about 0.1%, by weight of the coating mixture from which the sol is made. Nonlimiting examples of useful catalysts are HCl, $HNO_3$, $H_2SO_4$, $H_3PO_4$, protonated amines such as $N(H/R)_{3-n}[HX]$ where X comprises halides, nitrates, phosphates, or sulfates; n=0, 1, or 2; and R comprises an alkyl hydrocarbon chain, and combinations of the foregoing.

In one embodiment, a mixture of silane precursors including a tetraalkoxysilane, an organosilane, and an organofluorosilane may be used with isopropanol as a solvent in water and with 0.04 M HCl (acid) or 0.05 M $NH_4OH$ (base) as a catalyst. In one embodiment, a mixture of silane precursors including tetramethoxysilane or tetraethoxysilane, methyltrimethoxysilane, and trifluoropropyltrimethoxysilane may be used with isopropanol as a solvent in water and with 0.04 M HCl (acid) or 0.05 M $NH_4OH$ (base) as a catalyst. In some embodiments that contain prehydrolyzed organosilanes as the silane precursor, an acid catalyst may be used. In this case, the sol is a viscous liquid that can be used for making or applying the coating by rolling, screen printing, or by use of a brush or other mechanical implements to spread the sol evenly on the surface of a substrate.

The coating mixture may also optionally include other components to improve performance of the final coating or to improve stability and shelf life of the sol mixture prior to its application on a substrate. These additional components may include low molecular weight polymers, refractive index tuning additives, cross-linking additives, and surface modifying additives. It should be appreciated that these optional additives may be used separately or in any combination in a coating mixture. Further, it should be appreciated that these additional components can be used in any combination with any of the silane precursors and with any combination of solvents and acids or bases described above.

In some embodiments, the coating mixture from which the sol is made may optionally include a low molecular weight polymer. The polymer functions as a binder for mechanical stability of the coatings. It also helps with the uniform spreading of the sol liquid on a substrate to provide a homogeneous coating. In some embodiments, depending upon the intended use of the final coating, the amount of the polymer can vary from 0.1% to about 10%, from about 0.1% to about 1%, and from about 0.2% to about 0.5%, by weight of the of the coating mixture from which the sol is made. Examples of polymers that may be used include poly(3,3,3-trifluoropropylmethylsiloxane), tridecafluorooctylmethylsiloxane, and dimethylsiloxane copolymer, as well as combinations of these polymers. It also should be appreciated that combinations of polymers and acid catalysts may be used.

In some embodiments, the coating mixture from which the sol is made may optionally include a particle size modifying additive. As the refractive index ("RI") of the coating affects the light transmission through the coating or the anti-reflective behavior of the coating, components can be added to the coating mixture to tune the particle size distribution in the sol to adjust the refractive index of the coating to increase light transmission through the coating, thereby enhancing the anti-reflective ability of the coating. Non-limiting examples of the particle size modifying additives include sodium acetate-tris(hydroxymethyl)aminomethane or "TRIS" (—N-(2-acetamido)iminodiacetic acid-(4-(2-hydroxyethyl)-1-piperazineethanesulfonic acid) or "HEPES"-, 2-(N-morpholino)ethanesulfonic acid or "MES"-imidazole-propanolamine-, ethylenediamine-diethylenetriamine- and 3-aminopropyltrimethoxysilane-. In some embodiments, the use of the particle size tuning additives increases the light transmittance from about 0.5% to about 2.0% compared to a coating without a particle size tuning additive. The amount of particle size tuning additive used may range from about 0.01% to about 10% by weight of the coating mixture. In some embodiments, the range is from about 0.1% to about 2% by weight of the coating mixture. Example 2 below describes the use of a particle size modifying additive.

It should be appreciated that the anti-reflective property of the final coating is determined by both the coating composition and the coating thickness. A particularly surprising and advantageous feature of using a refractive index tuning additive is that in addition to enhancing the anti-reflective properties of the coatings, it also enhances the spreadability of the sol, which leads to the formation of better quality films. The hydrogen bonding groups on these refractive index tuning additives are effective at stabilizing sol particles via prevention of inter-particle aggregation. Because of their hydrogen bonding properties they alter the viscosity of the sol and make it suitable to form films with the desired thickness, which is in the range of 100-150 nm in some embodiments. Because of their polar and hydrophilic nature they also alter the interactions of the sol with glass substrates and, therefore, lower the surface tension of the sol to enable better spreading. The refractive index tuning additives also hydrogen bond with solvent molecules and, therefore, slow the rate of evaporation to enable uniform and homogeneous formation of coatings.

In some embodiments, the coating mixture from which the sol is made may optionally include a cross-linking additive to improve the abrasion resistance of the final coating. The abrasion resistance of the anti-reflecting coating is necessary for overall stability of the coating and for long term performance. The abrasion resistance of a coating relates to its ability to withstand the action of external mechanical forces that can lead to nicks and scratches, indentations, peeling, and associated loss of material from the coating. At a bulk level the abrasion resistance relates to hardness and/or stiffness of the coating, which in turn relates to the ability of the sol to form an extended network via cross-linking. The abrasion resistance of the final coating, therefore, can be enhanced by means of cross-linking additives that can increase the interactions between the particles by forming covalent linkages.

These optional cross-linking additives include silane coupling agents of the type α,ω-bis(trialkoxysilane). Specific examples of cross-linking agents from this category include bis(trimethoxysilyl)methane, bis(trimethoxysilyl)ethane, bis (trimethoxysilyl)hexane, bis(trimethoxysilyl)octane, bis (trimethoxysilylethyl)benzene, bis[(3-methyldimethoxysilyl)propyl]propylene oxide. Optionally, the cross-linking agent can be of the trifunctional type such as tris(3-trimethoxysilylpropyl)isocyanurate. Without being bound by theory, it is believed that these additives when added to the coating mixture increase cross-linking between particles and enhance the mechanical properties of the coatings.

These cross-linking additives can be added to the coating mixture from which the sol is formed or, in the case where separate sols are combined to form a final sol, the cross-linking additives can be added to that final sol. The amount of cross-linking additive used depends upon the amount of silane precursors used and is relative to the total amount of all the silane precursors used. The cross-linking additive to total silane ratio can vary from about 0.1 to about 1. In some embodiments, the cross-linking additive to total silane ratio is from about 0.2 to about 0.8. For trifunctional silane cross-linking additives, the cross-linking additive to total silane ratio is on the lower side of these ranges, while for bi-functional cross-linking additives, the cross-linking additive to total silane ratio it is on the higher side. Example 3 below describes the use of a cross-linking additive.

The coating composition may also optionally comprise surface modifying additives. Typically, the surface modifying additives would be used instead of a cross-linking additive. The surface modifying additives comprise a two component system with complementary functional groups that can react with each other to form a covalent bond. The surface modification of the coating is carried out by a two-step method. First, an active precursor with cross-linkable functional groups (e.g., a silane coupling agent with reactive functional groups) is incorporated into the sol mixture to form a coating containing the functional groups. Second, the coating is treated with a hydrophobic reactive agent that can react with the embedded functional groups. This second step is performed after the sol has gelled and as any solvent evaporates. In some embodiments, this may take from about 30 seconds to about 2 minutes. Once the gel sets, the gel is immersed in the hydrophobic reactive agent to initiate a reaction between the active precursor with cross-linkable functional groups (e.g., a silane coupling agent with reactive functional groups) and the hydrophobic reactive agent. Therefore, the active precursor with cross-linkable functional groups is incorporated into the coating followed by treatment of the coating with the hydrophobic reactive agent that can react with the functional groups in the coating to form a surface layer with hydrophobic groups on the surface.

The active precursor with cross-linkable functional groups may be a silane coupling agent incorporated into the sol that has functional groups such as alcohol or silanol (—OH) aldehyde (—CHO), or isocyanate (—NCO) while the hydrophobic reactive agent has amine (—NH or —NH$_2$ groups), silanol (—OH), or alkoxysilane groups. The silane coupling agent may be alkoxysilane precursors with functional groups that can react with the hydrophobic reactive agent. Nonlimiting examples of the silane coupling agent include triethoxysilyl butyraldehyde, hydroxymethyltriethoxysilane, 3-isocyanatopropyltriethoxysilane, 3-isocyanatopropyltrimethoxysilane, isocyanatomethyldimethoxysilane, and isocyanatomethyldiethoxysilane. Examples of the hydrophobic reactive agent include hexamethyldisilazane, hexamethylcyclotrisilazane, and dichlorohexamethyltrisiloxane. The amount of active precursor with cross-linkable functional groups used depends upon the total silane precursor present in the coating mixture. The active precursor to total silane precursor ratio can vary from about 0.1 to about 1. In some embodiments, the active precursor to total silane precursor ratio varies from about 0.2 to about 0.8.

Since the hydrophobic reactive agent is applied to the gel state of the coating mixture, the reactions that occur take place nominally on the surface of the gel. Therefore, the hydrophobic reactive agent is not applied in stoichiometric proportions. Typically, an about 1% to about 5% by weight solution of IPA is applied to the gel surface. In some embodiments, an about 1% to about 2% by weight solution of IPA is applied to the gel surface.

Example 4 below describes the use of a surface modifying additive. It should be appreciated that in some embodiments, the surface modification of the coating retains the optical and mechanical properties of the coating but increases surface contact angle by up to 15 degrees, which improves the anti-soiling or self-cleaning properties of the coating.

Table 1 lists various coating mixtures according to various embodiments of the present disclosure.

TABLE 1

| Fluorosilane (vol. %) | Organosilane (vol. %) | Solvent[1] (vol. %) | Acid (vol. %) | Polymer[2] (vol. %) |
|---|---|---|---|---|
| (tridecafluoro-1,1,2,2-tetrahydrooctyl)triethoxysilane (100%) | | | | |
| (tridecafluoro-1,1,2,2-tetrahydrooctyl)dimethylchlorosilane (100%) | | | | |
| (3,3,3-trifluoropropyl)tri-methoxysilane (100%) | | | | |
| (3,3,3-trifluoropropyl)tri-chlorosilane (100%) | | | | |
| (3,3,3-trifluoropropyl)methyldimethoxysilane (100%) | | | | |
| | methyltrichlorosilane (100%) | | | |
| | methyltrimethoxysilane (100%) | | | |
| | phenylmethyldi-ethoxysilane (100%) | | | |
| (tridecafluoro-1,1,2,2-tetrahydrooctyl)triethoxysilane (50%) | | I (50%) | | |
| (tridecafluoro-1,1,2,2-tetrahydrooctyl)dimethylchlorosilane (50%) | | I (50%) | | |
| (3,3,3-trifluoropropyl)tri-methoxysilane (50%) | | I (50%) | | |
| (3,3,3-trifluoropropyl)methyldimethoxysilane (50%) | | I (50%) | | |
| (3,3,3-trifluoropropyl)tri-chlorosilane (50%) | | I (50%) | | |
| | methyltrichlorosilane (50%) | I (50%) | | |
| | methyltrimethoxysilane (50%) | I (50%) | | |
| (tridecafluoro-1,1,2,2-tetrahydrooctyl)triethoxysilane (33%) | methyltrimethoxysilane (33%) | I (33%) | | |
| (tridecafluoro-1,1,2,2-tetrahydrooctyl)triethoxysilane (33%) | dimethyldimethoxysilane (33%) | I (33%) | | |
| (tridecafluoro-1,1,2,2-tetrahydrooctyl)triethoxysilane (33%) | n-propylmethyldichlorosilane (33%) | I (33%) | | |

TABLE 1-continued

| Fluorosilane (vol. %) | Organosilane (vol. %) | Solvent[1] (vol. %) | Acid (vol. %) | Polymer[2] (vol. %) |
|---|---|---|---|---|
| (3,3,3-trifluoropropyl)methyldi-methoxysilane (33%) | methyltrimethoxysilane (33%) | I (33%) | | |
| (3,3,3-trifluoropropyl)tri-methoxysilane (100%) | methyltrimethoxysilane (33%) | I (33%) | | |
| (tridecafluoro-1,1,2,2-tetrahydrooctyl)tri-ethoxysilane (33%) | methyltrimethoxysilane (33%) | I (32%) | 0.04m HCl (1%) | |
| (3,3,3-trifluoropropyl)tri-methoxysilane (33%) | methyltrimethoxysilane (33%) | I (32%) | 0.04m HCl (1%) | |
| (tridecafluoro-1,1,2,2-tetrahydrooctyl)tri-ethoxysilane (33%) | dimethyldimethoxysilane (33%) | I (32%) | 0.04m HCl (1%) | |
| (tridecafluoro-1,1,2,2-tetrahydrooctyl)tri-ethoxysilane (33%) | methyltrimethoxysilane (33%) | I (32%) | | A (1%) |
| (tridecafluoro-1,1,2,2-tetrahydrooctyl)tri-ethoxysilane (33%) | dimethyldimethoxysilane (33%) | I (32%) | | A (1%) |
| (3,3,3-trifluoropropyl)tri-methoxysilane (33%) | methyltrimethoxysilane (33%) | I (32%) | | A (1%) |
| (tridecafluoro-1,1,2,2-tetrahydrooctyl)tri-ethoxysilane (33%) | dimethyldimethoxysilane (33%) | I (32%) | | B (1%) |
| (tridecafluoro-1,1,2,2-tetrahydrooctyl)tri-ethoxysilane (33%) | methyltrimethoxysilane (33%) | I (32%) | | B (1%) |
| (3,3,3-trifluoropropyl)tri-methoxysilane (33%) | methyltrimethoxysilane (33%) | I (32%) | | B (1%) |

Other specific coating compositions according to various embodiments of the present disclosure include the following: (1) 0.38% tetramethoxysilane, 0.47% methyltrimethoxysilane, 0.56% trifluoropropyl trimethoxysilane, 0.05% HCl, 12.17% water, and 86.37% isopropanol; (2) 0.38% tetramethoxysilane, 0.47% methyl trimethoxysilane, 0.56% trifluoropropyl trimethoxysilane, 0.04% NH$_4$OH, 12.18% water, and 86.37% isopropanol; and (3) 0.34% tetramethoxysilane, 0.47% methyl trimethoxysilane, 0.56% trifluoropropyl trimethoxysilane, 0.05% HCl, 12.18% water, and 86.40% isopropanol, where all percentages are weight percent.

The methods for preparing or formulating the coating compositions or mixtures from which the final sol is prepared will now be described. As noted above, the composition of the coating composition is based on use of a silane precursor or mixture of silane precursors. In those cases in which only one silane precursor is used, the process for preparing the sol basically includes mixing the silane precursor and any solvent followed by the addition of any catalyst and then any other components. In those cases in which multiple silane precursors are used, the silane precursors can be mixed and hydrolyzed together or they can be hydrolyzed separately and then mixed together prior to coating a substrate. The strategy of hydrolyzing the precursors separately makes it possible to control the amounts of each precursor and also prevents extensive aggregation between the silanol species to maintain the low viscosity necessary for depositing thin films. It should be appreciated that it is also possible to hydrolyze some of the silane precursors together and hydrolyze one or more other silane precursors separately and then mix all of them together prior to coating a substrate.

For example, the compositions listed in Table 1 above are based on a one-pot reaction or batch process. The components are mixed together to form the liquid or sol that is deposited onto the substrate. The order of mixing includes mixing the solvent and silane precursor(s), then adding acid (if any) and then polymer (if any). In other embodiments in which only one silane precursor is used, the method involves adding the silane precursor, then the acid or base catalyst, and then water, followed by sonication. For other coating compositions, including those described in Examples 1, 2, and 3 below and those that use multiple silane precursors, the silanes can be hydrolyzed separately and then mixed together, or alternatively, they can be hydrolyzed together as a one-pot reaction system or batch process. In the latter case, the silane precursor(s) are added to the solvent followed by the addition of water. Then any acid or base catalyst is added followed by sonication. It should be appreciated that either a one-pot reaction to form the sol or formation of separate sols can be used; however, if multiple silane precursors are used, separate sol formation following by mixing provides better control over formation of the final mixed sol.

In one embodiment in which three silane precursors are used, a typical method of preparation involves hydrolysis of two of the silane precursors, such as an organosilane and an organofluorosilane, separately in isopropanol under acidic (or basic) conditions. In this case, each of the two silane precursors is separately mixed with a solvent and any acid or base in the amounts described above. Depending upon the total quantity being processed, mixing can be done by any method known in the art, including shaking, swirling, or agitation under ambient conditions. For larger volumes a larger scale mixer may be used.

After mixing, each of the two individual sols is prepared by hydrolyzing the respective silane precursor in an ultrasonic bath maintained at ambient conditions for 30 minutes. In other words, the first mixture of organosilane, solvent, and acid/base is placed in an ultrasonic bath, and the second mixture of organofluorosilane, solvent, and acid/base is separately placed in an ultrasonic bath. Sonication is used to enable mixing at a molecular level for the hydrolysis reaction to take place between water and the silane precursor, which are immiscible. A variation of the process involves hydrolysis in an ultrasonic bath at an elevated temperature to accelerate the hydrolysis process. In some embodiments, the temperature may be in the range of from about 40° C. to about 80° C. When hydrolyzed, these silane precursors form a particulate suspension of particles in a liquid or sol.

After being hydrolyzed, the two sols (e.g., one sol containing hydrolyzed organosilane and one sol containing hydrolyzed organofluorosilane) are mixed together along with a third silane precursor, for example, a tetraalkoxysilane, and the entire mixture is further sonicated for 30 minutes in the ultrasonic bath. The combined or final sol is then allowed to age under ambient conditions for a variable amount of time from 30 minutes to 48 hours. Aging is required for the sol-gel reactions (hydrolysis and condensation) to go to completion and for the sol to obtain a steady state condition. Aging time also facilitates reaction between particles from the different sols to form a homogeneous mixture. The relative extent of aging dictates sol viscosity and consequently film homogeneity and film thickness, which in turn, controls the anti-reflective properties of the coating. In some embodiments, longer aging times of 24-48 hours may be used since they allow sufficient time for the system to reach equilibrium. Shorter aging times may be used to prevent formation of bigger particles to obtain a targeted viscosity and coating thickness upon application of the sol to a substrate for sol systems that are too reactive or too concentrated.

Variations of this method may be made in some embodiments. For example, the final sol can be made by mixing all of the silane precursors concurrently in one container and hydrolyzing them together in one reaction. Alternatively, when using three silane precursors (e.g., an organosilane, an organofluorosilane, and a tetraalkylsilane) three separate sols can be formed and then mixed together to form the final sol, as opposed to forming two sols and then mixing these with a third silane precursor.

Also, the sonication times can vary from 30 minutes to 5 hours and can be done at room temperature conditions or can be done at elevated temperatures of up to 80° C. to facilitate to completion the sol-gel reactions of hydrolysis and condensation. Longer sonication times are preferred since they ensure that the reactions have reached steady-state equilibrium. Increasing temperature also helps the reactions to go to completion, which permit the use of shorter sonication times. Increased temperature may also assist in forming smaller particles, since the reaction rates may be significantly enhanced at higher temperature to form a large number of smaller particles as opposed to a smaller number of large particles. In some embodiments, small particles in the range of 1-10 nm are preferred for forming coatings with optimum anti-reflection properties. Also, as noted the aging time for the sol can vary from 30 minutes to 48 hours to allow sufficient time for the system to reach equilibrium and to produce the desired particle size and viscosity. In other words, the sonication time and temperature and the aging time can be adjusted to produce an equilibrated sol having the desired particle size, which in some embodiments is particles having a size of about 1 nm to about 10 nm, and viscosity. The application of the coating mixtures above will now be described. The coating mixtures described herein are used to form a uniform, homogenous, optical quality, crack-free coating that is largely devoid of defects and imperfections. The methods of fabricating a durable coating are based on a combination of factors including the composition of the coating mixture, the use of appropriate solvents or combination of solvents, substrate preparation, coating methods, and specific curing conditions.

In some embodiments, for example, the coating mixtures described in Table 1, the coating mixtures of the present disclosure may be in the form of a stable liquid composition that can be applied to a given substrate. The coating mixture that is applied to a substrate may also be in the form of a gel, lotion, paste, spray, or foam. In some embodiments, the coating mixture that is applied to a substrate is in the form of a liquid or viscous fluid or clear liquid. In some embodiments, the coating compositions are present as a clear liquid for use as a spray, or alternatively, as a dispersion, viscous liquid, or a mixture of these. In some embodiments, the coating mixtures have a viscosity in the range of approximately 0.5-5 cP for clear liquid compositions and approximately 10-200 cP in the form of pre-hydrolyzed viscous liquid, where pre-hydrolyzed refers to a liquid sol containing hydrolyzed particles or hydrolyzed silane precursors. It should be appreciated that in some cases, the coating mixture can be applied to the substrate before hydrolysis. In other words, the coating mixture is applied to the substrate after which the coating mixture is hydrolyzed and condensed with the aid of moisture in the air. Accordingly, the sol is formed on the substrate followed by formation of the final coating. It should be appreciated that the state of the coating mixture for application on a substrate can be determined based upon the form most applicable to form a thin film or coating in conjunction with the mechanical or physical method used for actually applying the coating mixture.

It should be appreciated that the coating material and process by which it is applied to the substrate comprise a larger coating system. The coating material is optimized for a particular coating method and vice versa. Thus the optimized coating process is preferentially performed by a custom designed tool to insure consistency and quality. Therefore this tool coupled with the coating materials comprises the coating system. Given that the benefits of the current disclosure are particularly well suited to solar panel manufacturers, who do not themselves manufacture tools, it is desirable to offer a complete solution consisting of both the coating material and its associated coating tool. In the following paragraphs describing the coating process it should be appreciated that these steps could be executed manually, automatically using a coating tool or in any combination of both.

Furthermore, the custom designed coating tool may be a large stand-alone unit intended for operation in a factory setting; it could be a sub-tool, such that it comprises a process module that performs the coating process but that is integrated into another machine that performs other steps in the larger solar panel manufacturing process. For example it could be a module attached to an existing glass washing machine or a module attached to a panel assembly machine. Alternatively, the tool could be portable or semi-portable for example mounted on a truck or inside a tractor trailer such that it could be transported to a worksite and used to coat solar modules during the construction of a large solar installation. Alternatively it could be designed such that the coating could be applied to installed solar modules in situ.

In general, three steps are used to apply the sol to a given substrate. First, the substrate is cleaned and prepared. Second, the substrate is coated with the sol or mixture of sols. Third, the final coating is formed on the substrate.

As an initial step, the substrate is pre-treated or pre-cleaned to remove surface impurities and to activate the surface by generating a fresh surface or new binding sites on the surface. The substrate pre-treatment steps are important in providing uniform spreading and deposition of the sol, effective bonding interactions between the substrate and coating material for Si—O—Si linkage formation, and prevention of defects and imperfections at the coating-substrate interface because of uneven spreading and/or diminished bonding interactions due to surface inhomogeneities.

In particular, it is desirable to expose Si—OH groups on the surface of the substrate through pre-treatment or cleaning of the substrate surface to form an "activated" surface. An activated surface layer lowers the surface tension of the predominantly hydrophilic solvents in the sol and enables effective spreading of the sol on the surface. In some embodiments, a combination of physical polishing or cleaning and/or chemical etching is sufficient to provide even spreading of the sol. In cases, where the surface tension would need to be further lowered, the substrate, such as glass, may be pretreated with a dilute surfactant solution (low molecular weight surfactants such as surfynol; long chain alcohols such as hexanol or octanol; low molecular weight ethylene oxide or propylene oxide; or a commercial dishwasher detergent such as CASCADE, FINISH, or ELECTRASOL to further help the sol spread better on the glass surface.

Accordingly, surface preparation involves a combination of chemical and physical treatment of the surface. The chemical treatment steps include (1) cleaning the surface with a solvent or combination of solvents, (2) cleaning the surface with a solvent along with an abrasive pad, (3) optionally chemically etching the surface, and (4) washing the surface with water. The physical treatment steps include (1) cleaning the surface with a solvent or combination of solvents, (2) cleaning the surface with a solvent along with particulate abrasives, and (3) washing the surface with water. It should be appreciated that a substrate can be pre-treated by using only the chemical treatment steps or only the physical treatment steps. Alternatively, both chemical and physical treatment steps could be used in any combination. It should be further appreciated that the physical cleaning action of friction between a cleaning brush or pad and the surface is an important aspect of the surface preparation.

In the first chemical treatment step, the surface is treated with a solvent or combination of solvents with variable hydrophobicity. Typical solvents used are water, ethanol, isopropanol, acetone, and methyl ethyl ketone. A commercial glass cleaner (e.g., WINDEX) can also be employed for this purposes. The surface may be treated with an individual solvent separately or by using a mixture of solvents. In the second step, an abrasive pad (e.g., SCOTCHBRITE) is rubbed over the surface with the use of a solvent, noting that this may be performed in conjunction with the first step or separately after the first step. In the last step, the surface is washed or rinsed with water.

One example of substrate preparation by this method involves cleaning the surface with an organic solvent such as ethanol, isopropanol, or acetone to remove organic surface impurities, dirt, dust, and/or grease (with or without an abrasive pad) followed by cleaning the surface with water. Another example involves cleaning the surface with methyl ethyl ketone (with or without an abrasive pad) followed by washing the surface with water. Another example is based on using a 1:1 mixture of ethanol and acetone to remove organic impurities followed by washing the surface with water.

In some instances an additional, optional step of chemically etching the surface by means of concentrated nitric acid, sulfuric acid, or piranha solution (1:1 mixture of 96% sulfuric acid and 30% $H_2O_2$) may be necessary to make the surface suitable for bonding to the deposited sol. Typically this step would be performed prior the last step of rinsing the surface with water. In one embodiment, the substrate may be placed in piranha solution for 20 minutes followed by soaking in deionized water for 5 minutes. The substrate may then be transferred to another container holding fresh deionized water and soaked for another 5 minutes. Finally, the substrate is rinsed with deionized water and air-dried.

The substrate may alternatively or additionally prepared by physical treatment. In the physical treatment case, for one embodiment the surface is simply cleaned with a solvent and the mechanical action of a cleaning brush or pad, optionally a surfactant or detergent can be added to the solvent, after which the substrate is rinsed with water and air dried. In another embodiment the surface is first cleaned with water followed by addition of powdered abrasive particles such as ceria, titania, zirconia, alumina, aluminum silicate, silica, magnesium hydroxide, aluminum hydroxide particles, or combinations thereof onto the surface of the substrate to form a thick slurry or paste on the surface. The abrasive media can be in the form a powder or it can be in the form of slurry, dispersion, suspension, emulsion, or paste. The particle size of the abrasives can vary from 0.1 to 10 microns and in some embodiments from 1 to 5 microns. The substrate may be polished with the abrasive slurry via rubbing with a pad (e.g., a SCOTCHBRITE pad), a cloth, or paper pad. Alternatively, the substrate may be polished by placement on the rotating disc of a polisher followed by application of abrasive slurry on the surface and rubbing with a pad as the substrate rotates on the disc. Another alternative method involves use of an electronic polisher that can be used as a rubbing pad in combination with abrasive slurry to polish the surface. The substrates polished with the slurry are cleaned by pressurized water jet and air-dried.

After pretreating the surface, the final sol is deposited on a substrate by techniques known in the art, including roll coating, dip coating, spraying, drop rolling, or flow coating to form a uniform coating on the substrate. Other methods for deposition that can be used include spin-coating; aerosol deposition; ultrasound, heat, or electrical deposition means; micro-deposition techniques such as ink-jet, spay-jet, xerography; or commercial printing techniques such as silk printing, dot matrix printing, etc. Deposition of the sol is typically done under ambient conditions.

In some embodiments, the method of deposition is performed via the drop rolling method on small surfaces wherein the sol composition is placed onto the surface of a substrate followed by tilting the substrate to enable the liquid to roll across the entire surface. For larger surfaces, the sol may be deposited by flow coating wherein the sol is dispensed from a single nozzle onto a moving substrate at a rate such that the flowing sol leads to a uniform deposition onto a surface or from multiple nozzles onto a stationary surface or from a slot onto a stationary surface. Another method of deposition is via depositing the liquid sol onto a substrate followed by use of a mechanical dispersant to spread the liquid evenly onto a substrate. For example, a squeegee or other mechanical device having a sharp, well-defined, uniform edge may be used to spread the sol.

In addition to the actual methods or techniques used to deposit the final sol on the substrate, it should be appreciated that several variations for depositing the final sol exist. For example, in one embodiment, the final sol is simply deposited on the substrate in one layer. In another embodiment, a single sol or multiple sols may be deposited to form multiple layers, thereby ultimately forming a multilayered coating. For example, a coating of the sol containing an organosilane and an organofluorosilane can be formed as an underlayer followed by a topcoat of a tetraalkoxysilane. In another embodiment, an underlayer of an organosilane may be deposited followed by the deposition of a topcoat of a mixture of an organofluorosilane and a tetraalkoxysilane. In another embodiment, an underlayer of a tetraalkoxysilane may be deposited followed by the deposition of a top layer using a sol mixture of an organosilane and an organofluorosilane. In another embodiment, an underlayer of a sol made from a mixture of an organosilane and an organofluorosilane may be deposited followed by vapor deposition of a top layer by exposing the layer to vapors of a tetraalkoxysilane. In another embodiment, an underlayer of a sol made from a mixture of an organosilane and an organofluorosilane may be deposited followed by deposition of a top layer by immersing the substrate in a solution of a tetraalkoxysilane in isopropanol. In the embodiments in which multiple layers are deposited, each layer may be deposited almost immediately after deposition of the first layer, for example, within or after 30 seconds of deposition of the prior layer. As noted, different sols may be deposited on top of one another, or different mixtures of sols may be deposited on top of one another. Alternatively, a single sol may be deposited in multiple layers or the same sol mixture may be deposited in multiple layers. Further, a given sol may be deposited as one layer and a different sol mixture may be used as another layers. Further, it should be appreciated that any combination of sols may be deposited in any order, thereby constructing a variety of multi-layered coatings. Further, it should be appreciated that the sols for each layer may be deposited using different techniques if so desired.

The thickness of the coatings deposited can vary from about 10 nm to about 5 micron. In some embodiments, the thickness of the coating varies from about 100 nm to about 1 micron, and in other embodiments it varies from about 100 nm to about 500 nm. In order to provide sufficient anti-reflective properties, a thickness of about 60 nm to about 150 nm is desired. It should be appreciated that the thickness of the coating mixture as deposited is affected by the coating method, as well as the viscosity of the coating mixture. Accordingly, the coating method should be selected so that the desired coating thickness is achieved for any given coating mixture. Further, in those embodiments, in which multiple layers of sols are deposited, each layer should be deposited in a thickness such that the total thickness of the coating is appropriate. Accordingly, in some embodiments in which multiple layers of sols are deposited, the overall coating thickness varies from about 100 nm to about 500 nm, and in order to provide sufficient anti-reflective properties, a total coating thickness of about 60 nm to about 150 nm is desired.

Once the final sol is deposited as described above, the deposited sol will proceed to form a gel through the process of gelation after which the gel is dried and cured to remove residual solvent and facilitate network formation via Si—O—Si linkage formation in the coating. In addition, the gel may be allowed to age to allow for the formation of additional linkages through continued hydrolysis and condensation reactions.

As described above, the sol-gel method used in preparing the coatings described herein utilizes a suitable molecular precursor that is hydrolyzed to generate a solid-state polymeric oxide network. Initial hydrolysis of the precursor generates a liquid sol, which ultimately turns to a solid, porous gel. Drying of the gels under ambient conditions (or at elevated temperature) leads to evaporation of the solvent phase to form a cross-linked film. Accordingly, throughout the process, the coating mixture/sol/gel/dried/cured coating undergoes changes in physical, chemical, and structural parameters that intrinsically alter the material properties of the final coating. In general, the changes throughout the sol-gel transformation can be loosely divided into three interdependent aspects of physical, chemical, and structural changes that result in altered structural composition, morphology, and microstructure. The chemical composition, physical state, and overall molecular structure of the sol and the gel are significantly different such that the materials in the two states are intrinsically distinct.

Regarding physical differences, the sol is a collection of dispersed particles suspended in a liquid. These particles are surrounded by a solvent shell and do not interact with each other significantly. As such, the sol is characterized by fluidity and exists in a liquid state. In contrast, in a gel film the network formation has occurred to an advanced state such the particles are interconnected to each other. The increased network formation and cross-linking makes the gel network rigid with a characteristic solid state. The ability of the material to exist in two different states is because of the chemical changes that occur along the sol to gel transformation.

Regarding chemical changes, during the sol to gel transition, the sol particles combine with each other via formation of Si—O—Si linkages. As a result, the material exhibits network formation and strengthening. Overall, the sol particles contain reactive hydroxyl groups on the surfaces that can participate in network formation while the gel structure has these hydroxyl groups converted into siloxane groups.

Regarding structural differences, the sol contains discrete particles containing few siloxane linkages along with terminal hydroxyl as well as unhydrolyzed alkoxy ligands. As such, the sol state can be considered structurally different from the solidified films which contain majority siloxanes. As such, the liquid sol and the solid state polymeric networks are chemically and structurally distinct systems.

Regarding differences in properties, the origin of the physical and chemical properties of the sol and gel films depends upon their structure. The sol particles and the gel films differ in the chemical composition, makeup and functional groups and as a result exhibit different physical and chemical properties. The sol stage because of its particulate nature is characterized by high reactivity to form the network while the gel state is largely unreactive due to conversion of reactive hydroxyl groups to stable siloxane linkages. Accordingly, it should be appreciated that it is the particular combination of silane precursors and other chemicals added to the coating mixture that is hydrolyzed and condensed, gelled, dried and cured on a substrate surface that gives the final coatings of the present disclosure the desired properties described above.

There are several methods by which the gel is dried and cured and/or aged to form the final coating. In some embodiments the gel is dried and cured under ambient or room temperature conditions. In some embodiments, the gel is aged under ambient conditions for 30 minutes followed by drying for 3 hours in an oven kept at a variable relative humidity of (e.g., 20% to 50%). The temperature of the oven is then increased slowly at a rate of 5° C./min to a final temperature of 120° C. The slow heating rate along with the moisture slows the rate of the silanol condensation reaction to provide a more uniform and mechanically stable coating. This method provides reproducible results and is a reliable method of making the coating with the desired properties.

In another embodiment, the gel on the substrate is heated under an infrared lamp or array of lamps. These lamps are placed close proximity to the substrate's coated surface such that the surface is evenly illuminated. The lamps are chosen for maximum emission in the mid-infrared region of 3~5 um wavelength. This region is desirable because it is adsorbed better by glass than shorter infrared wavelengths. The power output of the lamps may be closely controlled via a closed loop PID controller to achieve a precise and controllable temperature profile. In some embodiments this profile will start from ambient temperature and quickly rise 1~50 degrees centigrade per second to a temperature of 120 degrees centigrade, hold that temperature for a period of 30 to 300 seconds, then reduce temperature back to ambient, with or without the aid of cooling airflow.

In another embodiment, the coated substrate is heated on a hot plate at 120° C. such that the uncoated surface is in contact with the hot plate while the coated surface is exposed to air. In this case, the hot plate is turned on to a set temperature of 120° C. after the substrate has been placed on the hot plate. This ensures a slow heating rate to prevent cracking, flaking, and/or delamination of the coating material.

In another embodiment, the coating on the substrate is heated on a hot plate at 200-300° C. wherein the surface of the hot plate is covered with a silicone mat that is in direct contact with the surface of the coating to reach a desired curing temperature of 120° C. within 10-30 seconds. The conductive nature of the silicone mat makes it conducive to transfer heat to the coated surface to increase the continuing hydrolysis and condensation reactions. In this case, the coated surface can reach a temperature of 120° C. within 10-30 seconds.

It is particularly noteworthy that the coatings of this disclosure are prepared under temperatures not exceeding 120° C. in contrast to temperatures of 400-600° C. typically employed in curing silica-based anti-reflective coatings. Another particularly advantageous feature of some of the coating compositions herein, particularly those of Table 1, as opposed to the coating mixtures that utilize more than one or more than two silane precursors, is that they do not require water as a specific component of the composition for the reaction or curing process to proceed. It is particularly advantageous that the coating compositions can be made to harden by reaction with moisture within the environment or alternatively by the trace amounts of water present in the solvent. The curing of the coating in a humid environment slows down the evaporation of water leading to a coating with improved cross-linking and better mechanical properties.

As described above and as illustrated further in the Examples, the coatings made as described herein have several desirable properties. The coatings have anti-reflective properties that reduce the reflection of photons. The transmittance of a glass substrate coated with a coating composition made according to the present disclosure can vary from about 92% to about 98%, from about 93% to about 96%, and from about 95% to about 98%.

The coatings also have anti-soiling properties, which are also important in maintaining sufficient transmittance when used in conjunction with a glass substrate. Soiling is due to adherence of particulate matter on surfaces exposed to environment. The deposition of the particles onto surfaces depends upon the surface microstructure as well as chemical composition. In general, rough surfaces can provide many sites for physical binding of particulate matter. For solar panels, soiling can lead to reduction in power output due to reduced absorption of light of typically about 5% and in some cases losses of 22% have been reported. The paper "The Effect of Soiling on Large Grid-Connected Photovoltaic Systems in California and the Southwest Region of the United States", Photovoltaic Energy Conversion, Conference Record of the 2006 IEEE 4th World Conference, May 2006, Vol 2, p 2391-2395, reports an average 5% loss. The paper "Soiling and other optical losses in solar-tracking PV plants in Navarra", Prog. Photovolt: Res. Appl. 2011; 19:211-217, reports losses of 22%.

The chemical composition of the surfaces is reflected in the surface energy as measured by contact angles. Low energy surfaces (characterized by high water contact angles) are usually less susceptible to binding as compared to high energy surfaces with low water contact angles. Therefore, anti-soiling properties can be determined indirectly by measuring the coating's contact angle. The coatings herein provide contact angles ranging from about 80 degrees to about 178 degrees, from about 110 degrees to about 155 degrees, and from about 125 degrees to about 175 degrees. The coatings of this disclosure were also characterized for anti-soiling behavior by subjecting them to repeated cycles of dirt exposure followed by air cleaning (see, for example, FIGS. 9 and 10 and Table 3 below). The coatings of this disclosure minimize the photon flux losses due to soiling by about 50% relative to uncoated samples.

The coatings of the present disclosure also provide desirable mechanical properties. Nano-indentation is a method of used to measure the mechanical properties of nanoscale materials especially thin films and coatings. In nano-indentation measurements a load is applied to the indenter tip that provides the necessary force for the tip to be pushed into the sample thereby creating a nanoscale indent on the sample. Nano-indentation measurements involve continuous measurement of the load, contact stiffness, and depth of penetration of the tip with respect to time to record a load-displacement profile. The load displacement curves in combination with the contact displacement can be used to measure mechanical properties such as hardness and Young's Modulus (or modulus of elasticity). Noting that the typical hardness for a mixture of pure silica sol-gels coatings is observed to be around 1.05 GPa, the coatings of the present disclosure exhibit much greater hardness (see, for example, FIGS. 7a, 7b, 8a and 8b and Table 3 below). In addition, the pencil hardness of the coating of the present disclosure can vary from about 2H to about 9H, from about 4H to about 7H, and from about 6H to about 9H.

The coatings of the present disclosure also provide desirable abrasion resistance. Abrasion resistance can be defined as the ability of a material to withstand erosion due to frictional forces to preserve and maintain its original shape and appearance. Abrasion resistance relates to the strength of the intrinsic framework structure as well as to surface features. Materials that do not have sufficient strength due to lack of long range bonding interactions tend to abrade easily. Similarly, materials with uneven surfaces or coatings with surface inhomogeneities and asperities tend to wear due to frictional losses. Also, the leveling and smoothening of these asperities due to friction leads to changes in optical transmission of the coating as the material is abraded.

The coatings of the present disclosure pass the standard test for measuring abrasion resistance of coatings on surfaces as defined according to European Standard EN-1096-2 (Glass in Building, Coated Glass). The test involves the action of rubbing a felt pad on the coated glass. The felt rubbing pad is subjected to a to-and-fro translation motion with a stroke length of 120±5 mm at a speed of 54-66 strokes/min combined with a continuous rotation of the pad of 6 rpm or of a rotation of between 10° to 30° at the end of each stroke. The back and forth motion along with the rotation constitutes 1 cycle. The specifications of the circular felt rubbing pad include a diameter of 14-15 mm, thickness of 10 mm and density of 0.52 g/cm$^3$. The felt pad is attached to a mechanical finger that is 15 mm to 20 mm is diameter and placed under a load of 4 Newtons. The transmission at 550 and 900 nm is measured to evaluate abrasion resistance and the standard dictates a change in transmission of no more that ±0.05 with respect to a reference sample.

In general, the various coatings of the present disclosure provide a means of making a transparent substrate or glass transmit more photons without altering its intrinsic structure and other properties, along with passivating the surface so that it becomes resistant to the adhesion of water, dirt, soil, and other exogenous matter. Accordingly, the coating mixtures and resulting gels and coatings as described herein have varied commercial applications.

Regarding the coating mixtures themselves, these may be sold as a coating mixture or commercial coating formulation for others to use. For example, the coating mixtures may be provided as a liquid composition, for example, for subsequent small scale treatment of glass in a treatment separate from their usage as windows in solar or architectural systems. In this case the coating mixture may be sold before the silane precursors are hydrolyzed. Alternatively, the coating mixtures may be sold as sols or after the silane precursors have been hydrolyzed.

In addition, the coating mixtures may be deposited and allowed to gel on a particular substrate that is subsequently sold. In particular, the coating compositions of the present disclosure can be coated onto any transparent substrate that has hydrogen bond donor or hydrogen bond acceptor groups on the surface. For example, the coating can be applied as a treatment for a given glass or other transparent substrate before or after it has been integrated into a device, such a solar cell, optical window or enclosure, for example, as part of a glass treatment process. In other embodiments, the disclosure provides for the use of the coating compositions as an efficiency enhancement aid in architectural windows in building and houses by the provision of anti-reflection benefits and/or by the provision of anti-soiling benefits to augment the anti-reflection benefits. In other embodiments, the disclosure provides for the use of the coating compositions as an efficiency enhancement aid in treatment of transparent surfaces that require regular cleaning to make them self-cleaning. For example, the coatings can be used in conjunction with glass used in windows, windshields, screens, architecture, goggles, eyeglasses, etc.

In other embodiments, the disclosure provides for the use of the coating compositions as an efficiency enhancement aid in photovoltaic solar panel assemblies (e.g., the outer cover of solar panels) by the provision of anti-reflection benefits and/or by the provision of anti-soiling benefits to augment the anti-reflection benefits. These devices convert solar energy into electrical energy and rely upon efficient absorption of photons, and effects such as reflection, scattering, and loss of absorption due to adsorbed soil or dirt particles can lead to reduced power output. As noted, the coatings of this disclosure when coated onto a glass surface reduces reflection of photons (the so-called anti-reflective property) and also reduces adsorption and binding of dirt, soil, and other particulate matter from the environment to boost the transmission of photons through the glass as well as to prevent reduction in photons associated with deposition of particulate matter onto the surface.

The coatings for solar panel applications provide unique challenges that are not present with coatings typically utilized in other common applications. The use of anti-reflective coating in solar panels necessitates long term exposure of solar radiation that usually results in extensive degradation of polymeric materials under prolonged UV exposure due to photolytic breakdown of bonds in these materials. The coating compositions of the present disclosure utilize silane precursors that when hydrolyzed and dried and cured give rise to a network that is similar to glass with Si—O—Si bonds that are stable to radiative breakdown. An additional advantage of using silica based materials in solar applications is the intrinsic hardness of the material that makes the coating resistant to scratches, indentations, and abrasion. Further, the coatings of the present disclosure provide for enhanced light transmittance across the entire solar region from about 400 nm to about 1150 nm, which is desirable for solar applications.

Further, it should be appreciated that the sols resulting from the coating compositions of this disclosure do not need to be applied to the solar panels during manufacturing and may be applied after manufacturing to avoid any interference with the solar panel manufacturing process. It is expected that the solar panel maker themselves may be able to use the composition of this disclosure to coat the modules at appropriate points within their manufacturing process. In such instances, the provision of a stable sol, that can be used according to the methods described herein, provides a direct means for the applying the coating mixture after manufacture of the panels or even after final installation of the panels. This may streamline the manufacturing process and enhance the economic value of existing panels, either existing inventory or panels already installed and in use, to which the coatings can be applied.

Coating mixtures that can be used specifically for coating solar panels include (1) 0.38% tetramethoxysilane, 0.47% methyl trimethoxysilane, 0.56% trifluoropropyl trimethoxysilane, 0.05% HCl, 12.17% water, and 86.37% isopropanol; (2) 0.38% tetramethoxysilane, 0.47% methyl trimethoxysilane, 0.56% trifluoropropyl trimethoxysilane, 0.04% NH4OH, 12.18% water, and 86.37% isopropanol; and (3) 0.34% tetramethoxysilane, 0.47% methyl trimethoxysilane, 0.56% trifluoropropyl trimethoxysilane, 0.05% HCl, 12.18% water, and 86.40% isopropanol, where all percentages are weight percents.

In one embodiment, the process of coating the solar panels consists of preparing the panel surface, coating the surface with the final sol made in accordance with the present disclosure, drying the coating under ambient conditions, and curing the dried panels at elevated temperature. The panel surface is prepared by polishing the panel with a cerium oxide slurry, followed by washing the panel with water, and drying it under ambient temperature-pressure conditions for a period ranging from about 10 hours to about 12 hours.

Once the panel surface is prepared, in one embodiment, the final sol of the present disclosure is deposited onto solar panels by means of a flow coater. The sol is deposited onto the panels via gravitational free flow of the liquid sol from top to bottom. The solar panels are placed on the mobile platform that moves at a rate that is optimal for the free flow of the sol without introducing break points in the liquid stream or introducing turbulent flow. The rate of liquid flow and the rate of movement of platform carrying the solar panel are optimized for deposition of uniform, crack-free coatings that are homogenous, free of deformities, and characterized by uniform thickness.

More specifically, in one embodiment, the panel is placed on a mobile stage that is connected to a computer and programmed to move at a speed ranging, in some embodiments, from about 0.05 cm/s to about 300 cm/s, in other embodiments from about 0.1 cm/s to about 10 cm/s, and in other embodiments from about 0.25 cm/s to about 0.5 cm/s. The sol is then deposited onto the panel surface using a nozzle dispensing unit (that is connected to a computer) such that the rate of flow of sol is, in some embodiments, from about 5 ml/min to about 50 ml/min, in other embodiments from about 5 ml/min to about 25 ml/min, and in other embodiments from about 10 ml/min to about 15 ml/min. It should be appreciated that the rate at which the sol is deposited is important for proper deposition of the coatings. Notably, the nozzle diameter of the sol can be adjusted to ensure appropriate flow rate, with diameters of the nozzle ranging from about 0.3 mm to about 0.9 mm.

A particularly advantageous aspect of using a sol is that it is in a liquid state but is also viscous enough to spread without breakdown of the stream. The uniformity of the coatings is further ensured by adjusting the flow rate and the rate of the movement of the platform containing the solar panels. For a given flow rate of the sol, if the rate of the movement of the platform is too fast then it leads to rupture of the sol stream causing uneven coatings. For a given flow rate of the sol, if the rate of the movement of the platform is too slow it results in turbulent flow that deteriorates the uniformity of the films. Therefore, a specific optimum of sol flow rate and the platform movement are important to provide even, uniform, and homogenous coatings. The use of specific pH, solvent, and silane concentrations as outlined above provide the ideal viscosities.

The coating process is also facilitated by the evaporation of the solvent during the flow of the sol onto the panel, which also affects the development of uniform films or coatings on the panel surface. The coatings are formed when the free flowing sol dries on the surface and forms a solid on the glass surface. More specifically, the bottom edge of the sol represents the wet line while drying occurs at the top edge. As the solvent evaporates, the sol becomes more viscous and finally sets at the top edge while the bottom edge is characterized by liquid edge spreading. The spreading liquid at the bottom edge enables the free flow of the sol while the setting sol at the top edge fixes the materials and prevents formation of lamellar structures. A balance of these factors is important for formation of uniform films.

It should be appreciated that the flow coating method does not allow seepage of the sol into the internal parts of the solar panel assembly as the excess sol can be collected into a container at the bottom of the assembly and recycled. Similarly, it does not facilitate corrosion and/or leaching of the chemicals from the interior of the solar panel assembly. The flow coater method exposes only the glass side to the sol while the other side of the panel assembly with electrical contacts and leads does not come into any contact with the liquid sol. As such, the flow coating process is particular beneficial to coating solar panels during either the assembly or the post-assembly stages.

The methods described here can be used to coat solar panels of variable sizes and in variable configurations. For example, typical panels have the dimensions of 1 m×1.6 m, which can be coated either in portrait configuration or in landscape mode via appropriate placement the mobile platform.

The flow coater can be used to coat the panels at the rate of about 15-60 panels per hour. The rate of coating of individual panels would depend upon the size of the panels and whether they are coated in the portrait mode or landscape orientation. Additionally, multiple coaters operating in parallel can be used in conjunction with the panel assembly line to increase the production rate.

After depositing the coating, the panel is dried for a period ranging from about 1 minutes to about 20 minutes or longer under ambient conditions. The coated panel is then cured using any of the techniques for curing described above, after which the coated panel is ready for use.

The anti-reflecting coatings described herein increase the peak power of the solar cells by approximately 3% due to the anti-reflective property. In addition, it is estimated that the anti-soiling property would contribute to minimize transmissive losses associated with accumulation of dirt on the panels. Typical soiling losses are estimated at about 5% and use of these coatings is expected to reduce the losses in half.

EXAMPLES

The following describes various aspects of the coatings made according to certain embodiments of the disclosure in connection with the Figures. These examples should not be viewed as limiting.

In one embodiment referred to as Example 1, Sol I was prepared by first mixing 22.5 mL of isopropanol (IPA) and 2.5 mL of 0.04M HCl (pH 1.5). 100 µL of methyltrimethoxysilane (MTMOS) was then added to this mixture. The final solution of IPA, HCl, and MTMOS was then sonicated in a sonicator for 35 minutes. Sol II was prepared by first mixing 22.5 mL of IPA and 2.5 mL of 0.04M HCl (pH 1.5) followed by adding 100 µL of (3,3,3-trifluoropropyl)-trimethoxysilane (F3TMOS). Sol II was also sonicated for 35 minutes. After sonication, Sol I and Sol II was mixed in equal parts (12.5 mL each), and 100 µL of tetramethoxysilane (TMOS) was added. This final solution was then sonicated for 35 minutes. This mixture was allowed to age under ambient conditions for 24 hours up to 120 hours. After aging, microscope slides (polished with cerium oxide polish, washed, and allowed to dry) were flow coated with the final sol mixture and allowed to dry for approximately 5-10 minutes. Once dry, the slides were cured in one of two ways. In one method, the slides were placed coated side up on a hot plate/stirrer for 45 minutes at 120° C. In the other method, they were placed in an oven at 25° C. for 25 minutes. The temperature was then raised at a constant rate over a period of 20 minutes to 120° C., and then maintained at 120° C. for 180 minutes. The temperature was then cooled to 25° C. at a constant rate over a period of 60 minutes.

In one embodiment demonstrating the use of a particle size modifying additive (referred to as Example 2, a sol was prepared using tris(hydroxymethyl)aminomethane (TRIS) as follows: A sol was prepared according to the process in Example 1. After final sonication, the mixture was allowed to chill in refrigerated water for 5 minutes and then stand at room temperature for at least 10 minutes. After this, 0.5 to 2 mL of 0.5 M solution of TRIS was then added to the mixture, which was then shaken and allowed to age for 5 minutes. After aging, microscope slides (polished with cerium oxide polish, washed, and allowed to dry) were then flow coated with the final sol mixture and allowed to dry for approximately 5-10 minutes. Once dry, the slides were cured in either one of two ways. In one method, the slides were placed coated side up on a hot plate/stirrer for 45 minutes at 120° C. In the other method, they were placed in an oven at 25° C. for 25 minutes. The temperature was then raised at a constant rate over a period of 20 minutes to 120° C., and then maintained at 120° C. for 180 minutes. The temperature was then cooled to 25° C. at a constant rate over a period of 60 minutes. With these coatings, an anti-reflective enhancement of 3.45% at the maximum transmittance and 2.77% averaged over the solar range was observed.

In one embodiment demonstrating the use of a cross-linking additive referred to as Example 3, a sol was prepared according to the process in Example 1. After the final sonication, the mixture was allowed to chill in refrigerated water for 5 minutes and then stand at room temperature for at least 10 minutes. After this 1 mL of 0.5 M solution of TRIS was added to the mixture. After mixing the components, a variable amount (50 µL to 250 µL) of a cross-linker was added. The sol is allowed to further age for 5 minutes prior to deposition on the substrate.

One variant of Example 3 includes adding a variable amount (50 µL to 250 µL) of the cross-linking additive individually to each sol (Sol I and Sol II) followed by the same sequence of steps. Another variant of Example 3 includes mixing Sol I, Sol II, and TMOS along with a variable amount (50 µL to 250 µL) of the cross-linking additive followed by sonication and then adding TRIS to the mixture. Another variant of Example 3 includes making a multilayer coating with an underlayer made from, for example, the coating described above in connection with the use of TRIS as the particle size modifying additive, followed by depositing an overlayer of 1-5% by volume of cross-linking additive dissolved in IPA.

In one embodiment demonstrating the use of a surface modification additive referred to as Example 4. Sol I and sol II are prepared using the process described in Example 1. Then equal parts (12.5 mL each) were mixed, and 100 µL of TMOS was added along with a variable amount (50 µL to 250 µL) of triethoxysilylbutyraldehyde followed by sonication for 35 minutes. The sol was allowed to further age for 5 minutes prior to deposition on the substrate. The substrate containing the coating was further immersed in a solution of hexamethyldisilazane (1% by weight in IPA). The coating was allowed to dry on a hot plate at 70° C. for 1 hour to allow the condensation reaction to take place between the aldehyde group and amino groups. The substrate containing the coating was then cured at 120° C. for 45 minutes.

One variant of Example 4 includes forming the coating with the sol mixture from Examples 1, 2, or 3 above followed by surface treatment of the coating with the silane coupling agent (1% IPA) followed by treatment with hydrophobic reactive agent (1% IPA). Another variant of Example 4 includes forming one of the following three sol coatings ((1) 0.38% TMOS, 0.47% MTMOS, 0.56% F3TMOS, 0.05% HCl, 12.17% water, and 86.37% IPA; (2) 0.38% TMOS, 0.47% MTMOS, 0.56% F3TMOS, 0.04% NH4OH, 12.18% water, and 86.37% IPA; or (3) 0.34% TMOS, 0.47% MTMOS, 0.56% F3TMOS, 0.05% HCl, 12.18% water, and 86.40% IPA, where all percentages are weight percent) followed by surface treatment with hydrophobic reactive agent (1% solution in IPA).

Where applicable, the measurement of anti-reflective properties of the coatings was done as follows: The transmittance of the coatings was measured by means of UV-vis absorption spectrophotometer equipped with an integrator accessory. The anti-reflective enhancement factor is measured as the relative percent increase in transmittance compared to untreated glass slides versus glass slides coated with compositions of this disclosure. ASTM E424 describes the solar transmission gain, which is defined as the relative percent difference in transmission of solar radiation before and after the application of the coating. The coatings exhibit about 1.5% to about 3.25% gain in solar transmission. The refractive index of the coating was measured by an ellipsometer. Embodiments of the disclosure have refractive index between about 1.3 and about 1.45, and between about 1.33 and about 1.42 and between about 1.39 and about 1.41.

The abrasion resistance of the coating is measured by an abrader device according to European standard EN-1096-2 (glass in building coated glass). The coatings made according to Examples 1, 2, and 3, without any added composition modifying additives, are able meet the passing criteria of the standard.

The contact angle of the coatings is measured by means of goniometer wherein the contact angle of the water droplet is measured by means of a CCD camera. An average of three measurements is used for each sample.

Table 2 presents the results of several performance tests performed on coatings made according to Example 1. In this Table, the "Spec" refers to the formal procedure for the test performed; the "Pass Criteria" refers to the allowable change in % transmittance (% T) in order for a sample to pass the test; "N" is the number of samples/experiments tested; and "Results delta T" is the average of the observed change in percent transmittance (% T) for the N samples/experiments.

TABLE 2

| Test | Conditions | Duration | Spec# | Pass Criteria | N | Result ΔT |
| --- | --- | --- | --- | --- | --- | --- |
| Abrasion Resistance | 400 g, 14 mm Felt Pad | 1000 Strokes | EN1096.2 | <0.5% | — | 0.2% |
| Damp Heat | 85° C./85% RH | 1000 Hrs | IEC61215 IEC61646 | <3% | 4 | 0.3% |
| Temperature Cycle | −40° C. to +85° C. | 200 Cycles | IEC61215 IEC61646 | <3% | 4 | 0.4% |
| Humidity Freeze | −40° C. to +85° C., 85% RH | 10 Cycles | IEC61215 IEC61646 | <3% | 4 | 0.2% |
| UV Exposure | New River, Arizona: EMMAQUA Day spray with night time wetting | 13,092 MJ/m$^2$ (Total) 279 MJ/m$^2$ (295-385 nm) | ASTM G90 | <3% ΔWCA <10° | 2 | 0.3% 3° |
| Corrosive Atmosphere | 1 vol % of SO$_2$ | 1200 Hrs | DIN50018 UL1332 | <1% | 5 | 0.8% |
| Salt Spray | 5% NaCl in H$_2$O pH 6.5-7.2 at 35° C. | 200 Hrs | DIN50021 UL50 | <1% | 5 | 0.5% |
| Chemical Resistance (Acid) | 1M HCl 1M H$_2$SO$_4$ 1M HNO$_3$ | 30 min | | <0.5% | 3 3 3 | 0.3% 0.4% 0.3% |
| Chemical Resistance (Base) | 1M NH$_4$OH 0.67% aq. (.1675M) NaOH | 30 min 50 min | | <0.5% | 3 3 | 0.1% 0.2% |
| Boiling Water | 100° C. | 10 min | | <0.5% | 4 | 0.0% |
| Industrial Contaminants | Wet glass + toner | 5 pass with squeegee wash with water. | | <1% | 3 | 0.2% |
| Cleaning Tests | Common Detergents Windex | 1000 brush strokes | | <1% | 3 3 | 0.3% 0.2% |

These results are broadly similar to reliability test results achieved by existing anti-reflective coatings. However, they are significant in that they have been achieved with a coating cured at just 120° C. Existing anti-reflective coatings are typically sintered at 400–600° C. to achieve the level of reliability indicated by these results.

FIG. 1 illustrates the UV-vis transmittance spectra showing maximum transmittance enhancement of 2% with coatings on glass slides made from composition given in Example 1.

Figure 2:
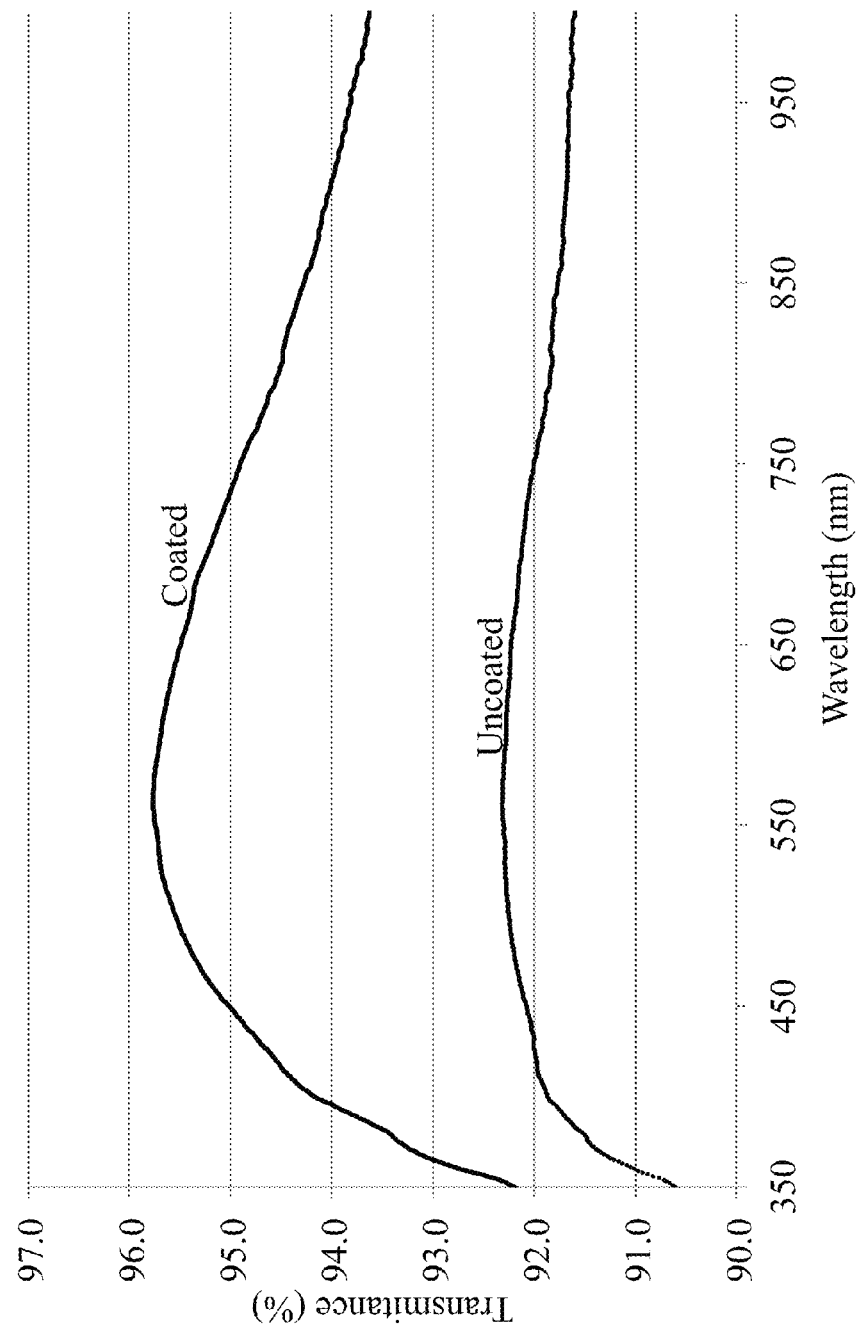
FIG. 2 illustrates the UV-vis transmittance spectra showing maximum transmittance enhancement of 3.4% with coatings on a glass slides substrate made from composition given in Example 2.

FIG. 2 illustrates the UV-vis transmittance spectra showing maximum transmittance enhancement of 3.4% with coatings on a glass slides substrate made from composition given in Example 2.

Figure 3A:
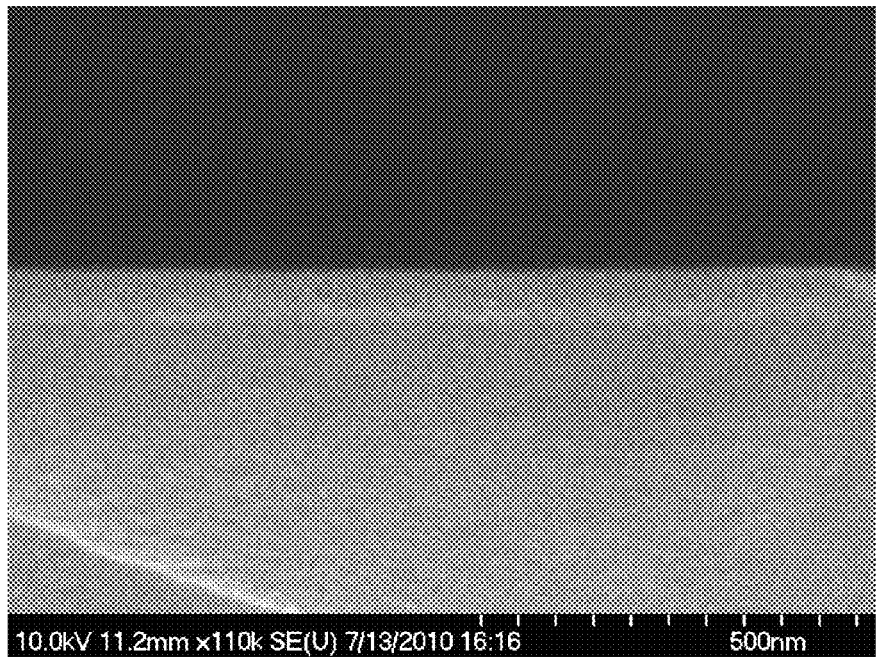
FIG. 3a is an SEM cross-sectional view of a coating made from the composition of Example 1 on a glass slide substrate.

FIG. 3a is an SEM cross-sectional view of a coating made from the composition of Example 1 on a glass slide substrate. The SEM images show the absence of any discernible porosity in these coatings. The film thickness about 90 nm.

Figure 3B:
FIG. 3b is a SEM oblique view of a coating made from the composition of Example 1 on a glass substrate.

FIG. 3b is a SEM oblique view of a coating made from the composition of Example 1 on a glass substrate.

Figure 4A:
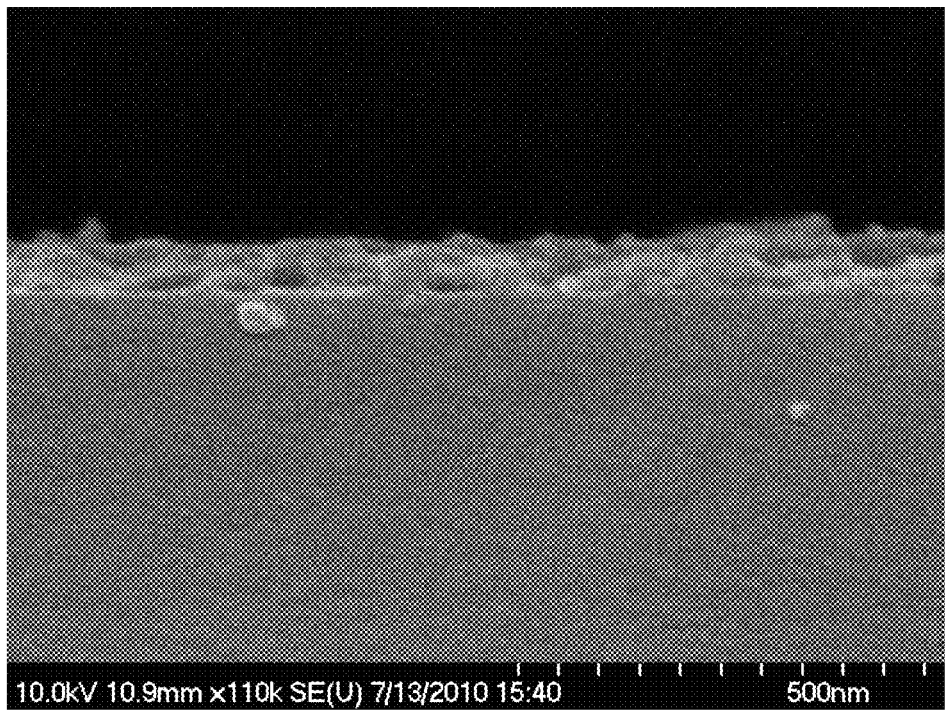
FIG. 4a is an SEM cross-sectional view of a coating made from the composition of Example 2 on a glass slide substrate.
Figure 4B:
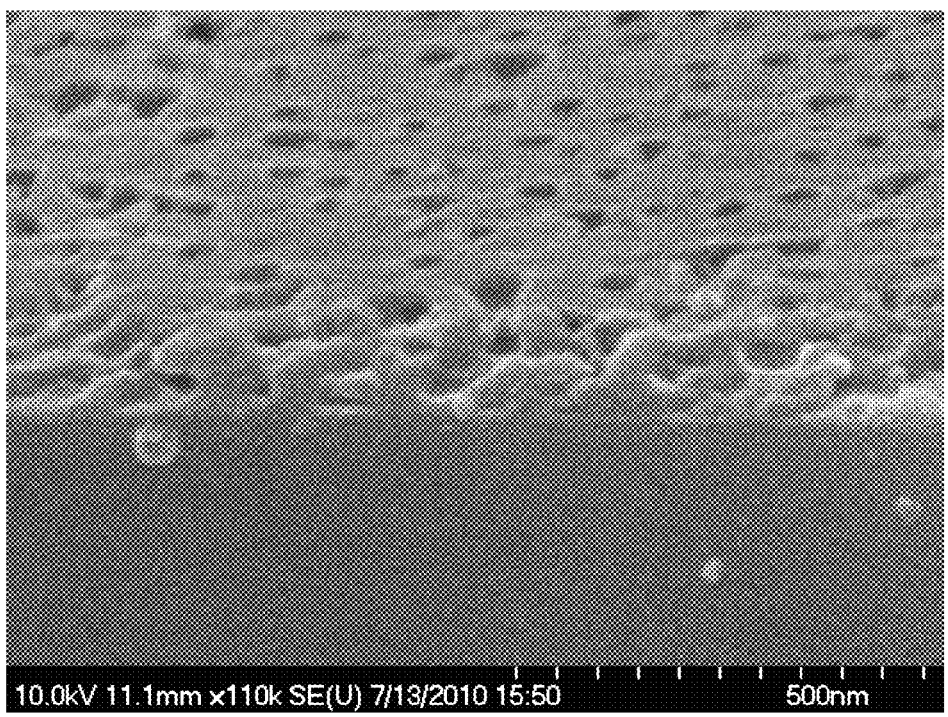
FIG. 4b is a SEM oblique view of a coating made from the composition of Example 1 on a glass substrate.

FIG. 4 is an SEM cross-sectional view of a coating made from the composition of Example 2 on a glass slide substrate. The SEM images show increased porosity in these coatings along with presence of surface roughness on these coatings. The film thickness is about 100 nm.

Figure 5:
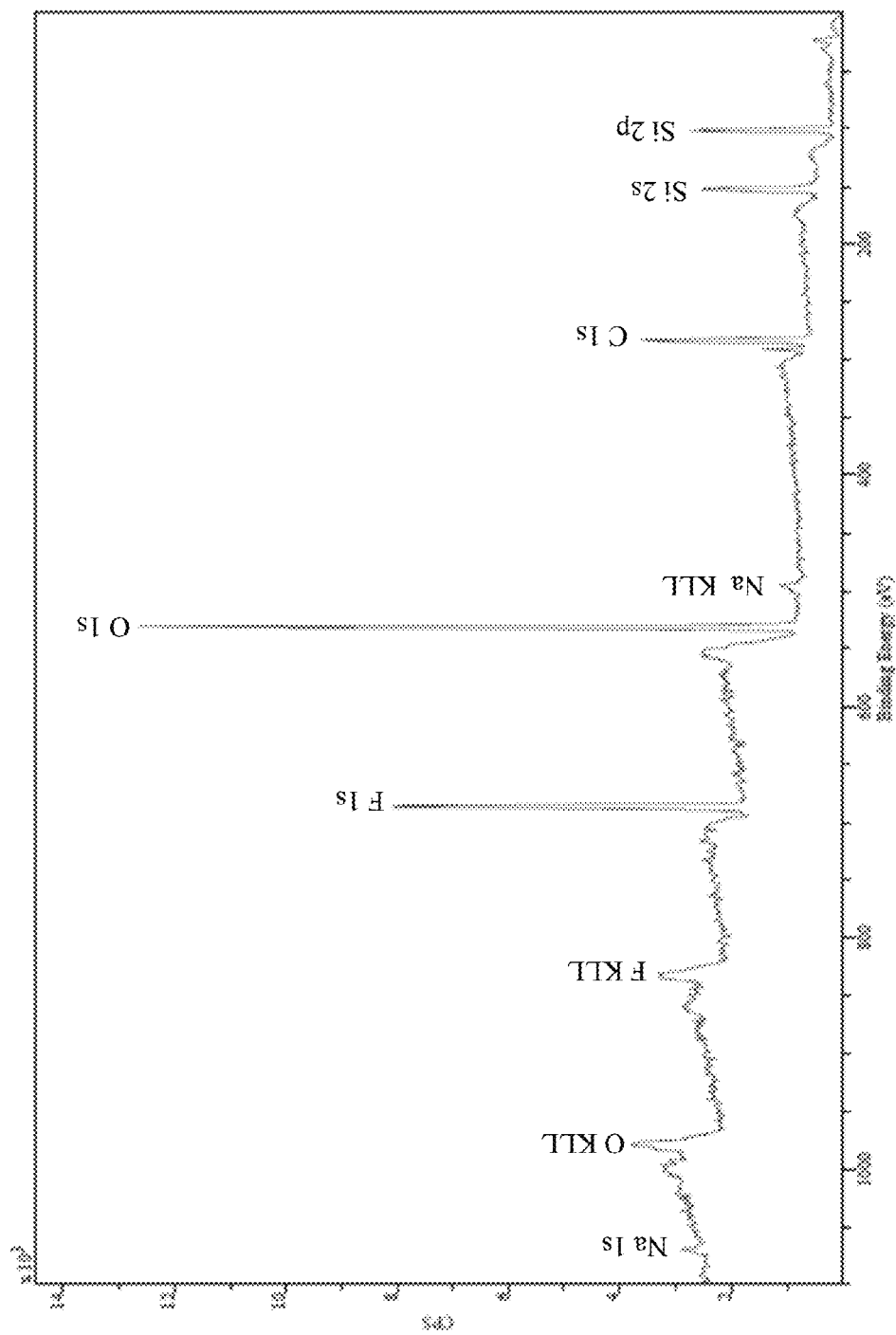
FIG. 5 shows an XPS spectrum of a coating made from the composition of Example 1.

FIG. 5 shows an XPS spectrum of a coating made from the composition of Example 1. The peaks indicate presence of fluorine in the coatings coming from incorporation of (3,3,3-trifluoropropyl)trimethoxysilane along with silicon and oxygen from silicate network and carbons from the organic components present in the coating.

Figure 6:
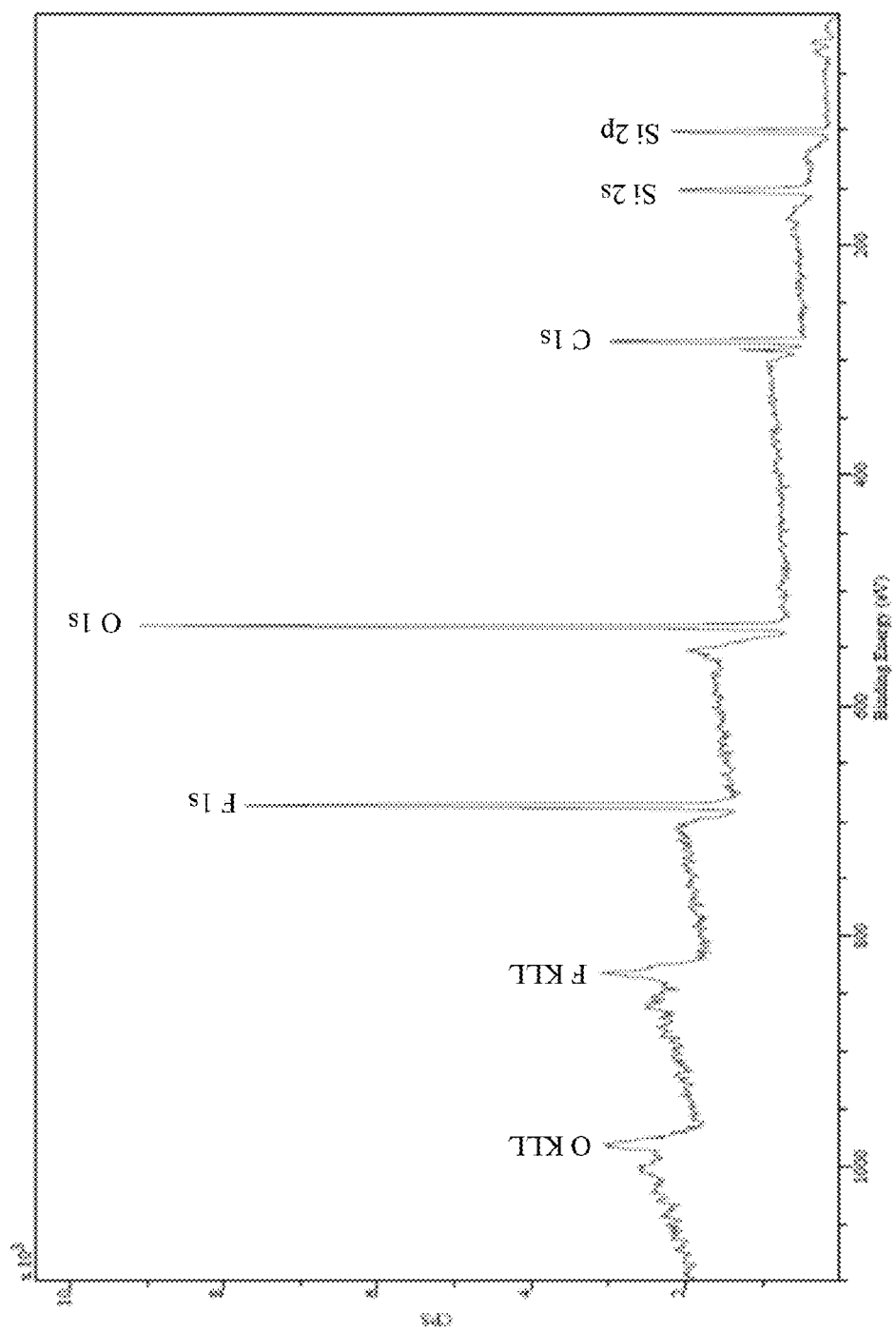
FIG. 6 shows an XPS spectrum of a coating made from the composition of Example 2.
Figure 7A:
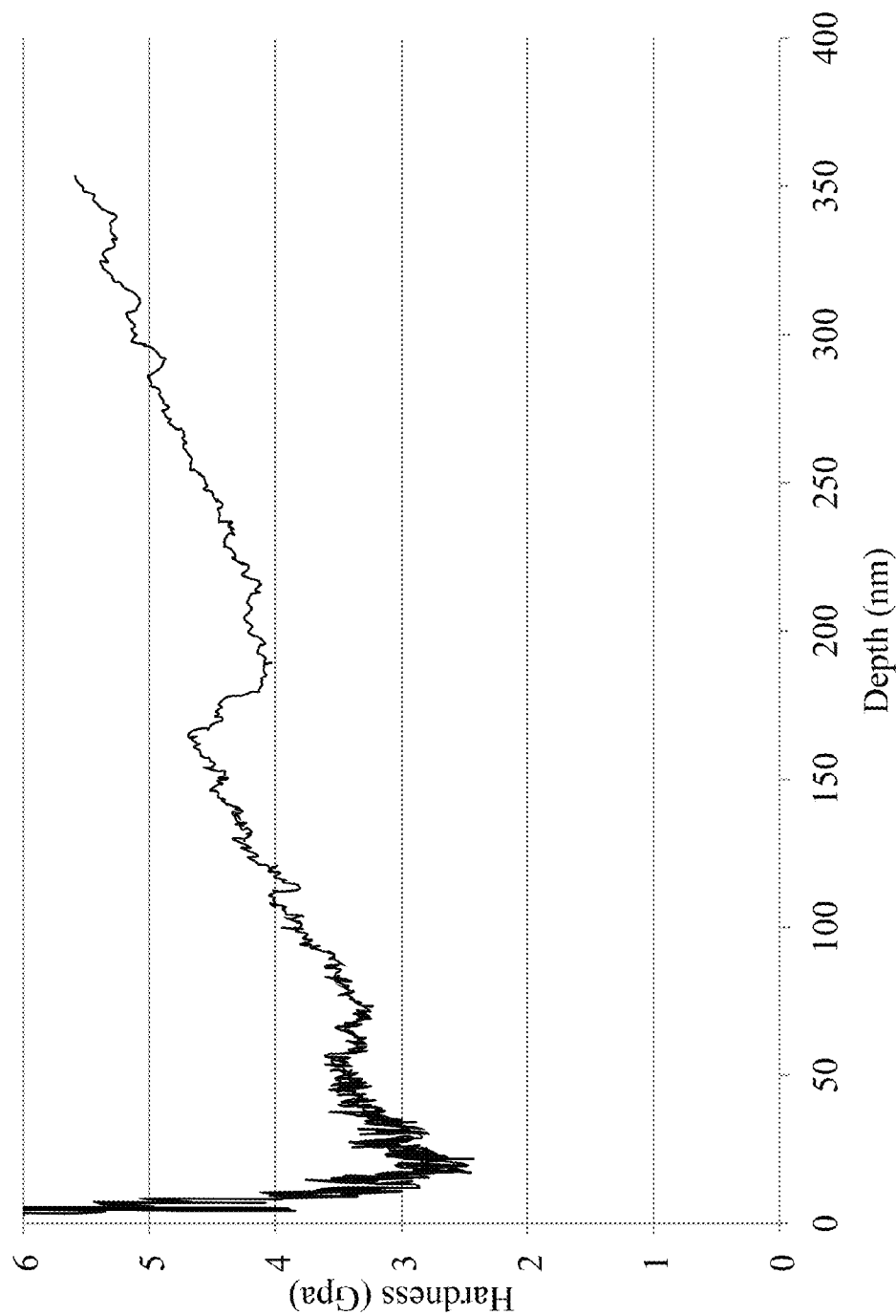
FIG. 7a illustrates nano-indentation data showing the indenter depth profile and hardness, of a coating made from the composition of Example 1 on a glass slide substrate.
Figure 7B:
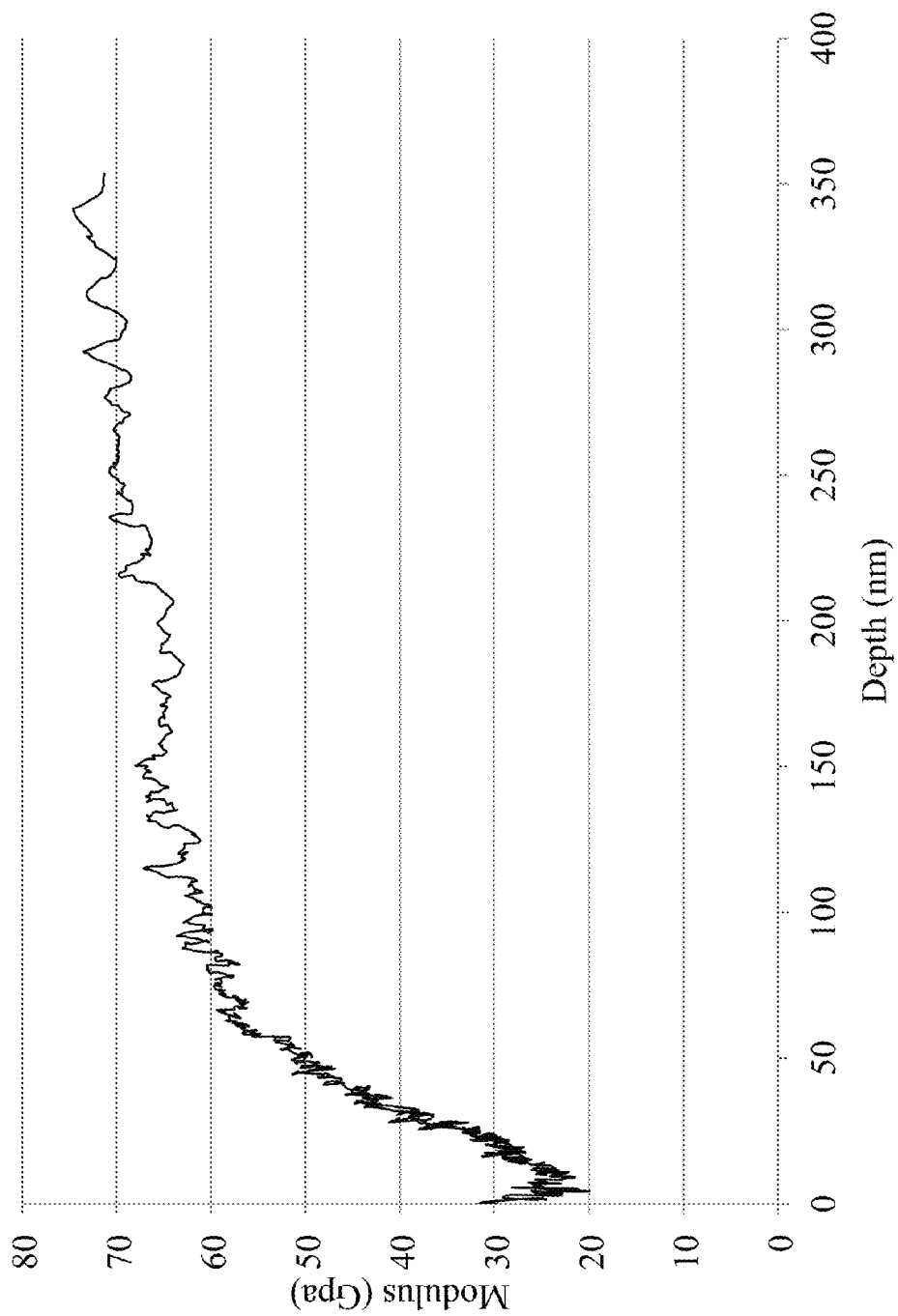
FIG. 7b illustrates nano-indentation data showing the indenter depth profile and Young's Modulus, of a coating made from the composition of Example 1 on a glass slide substrate.
Figure 8A:
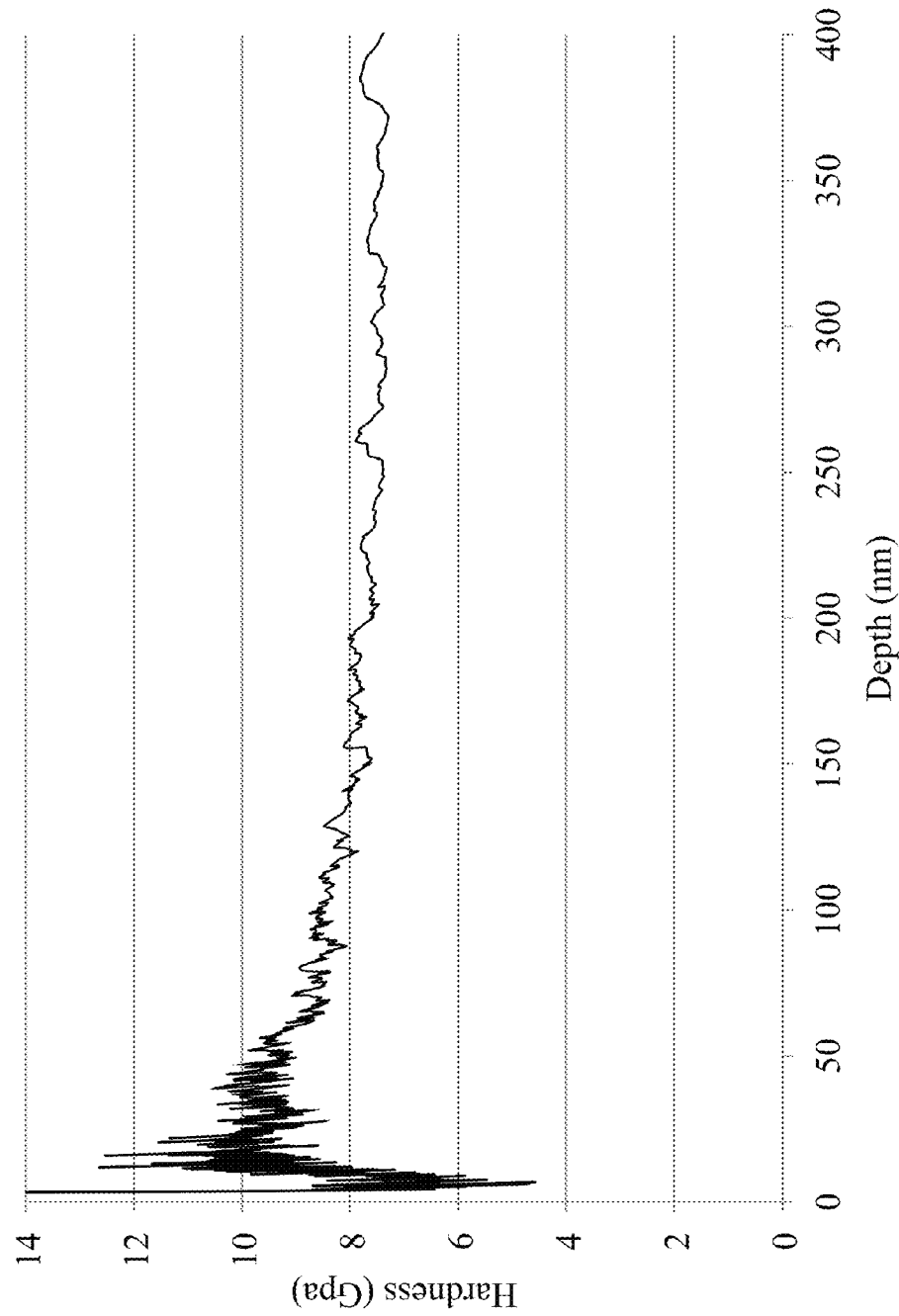
FIG. 8a illustrates nano-indentation data showing the indenter depth profile and hardness, of a coating made from the composition of Example 2 on a glass slide substrate.
Figure 8B:
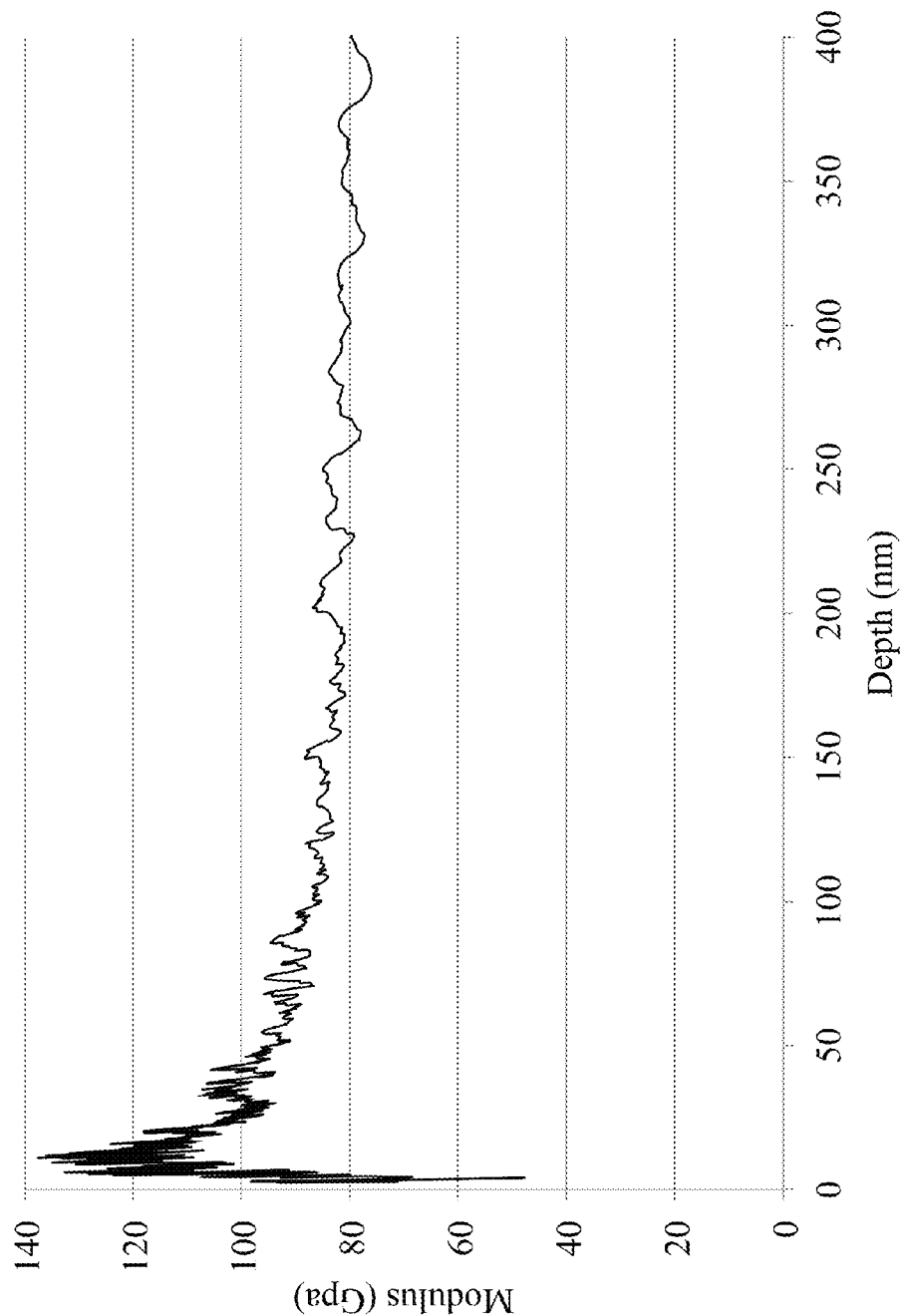
FIG. 8b illustrates nano-indentation data showing the indenter depth profile and Young's Modulus, of a coating made from the composition of Example 2 on a glass slide substrate.

FIG. 6 shows an XPS spectrum of a coating made from the composition of Example 2. The peaks indicate presence of fluorine in the coatings coming from incorporation of (3,3,3-trifluoropropyl)trimethoxysilane along with silicon and oxygen from silicate network and carbons from the organic components present in the coating.

FIGS. 7a, 7b, 8a and 8b illustrate nano-indentation data showing the indenter depth profile, hardness, and Young's Modulus of a coating made from the composition of Examples 1 and 2 on a glass slide substrate. The results of these measurements are summarized in Table 3.

Table 3 lists various properties for coatings made according to various embodiments of the present disclosure, wherein "hardness" is amount of force (in GPa) exerted by the indenter before the film can exhibit plastic deformations, "contact angle" is the angle of liquid/air interface at a solid surface or the angle the liquid drop makes with a solid substrate, and "transmission increase" is calculated as $\{[\%\,T\,\text{coated} - \%\,T\,\text{uncoated}]/[\%\,T\,\text{uncoated}]\} \times 100$. It should be appreciated that in some embodiments, the coatings of the present disclosure provide an increase in transmission from about 1% to about 3.5% and in some embodiments from about 1.5% to about 3%, and a contact angle of about 80° to about 120° and in some embodiments about 85° to about 100°.

Nano-indentation measurements were performed with a Berkovich nanoindentation system. Typical hardness for a mixture of pure silica sol-gels coatings is observed to be around 1.05 GPa. Without wishing to be bound by theory, the enhanced mechanical properties of the coatings of this disclosure (as compared to pure silica-based coatings) may be due to several factors that contribute to increased hardness. First, the extensive cross-linking due to the use of the three-precursor system makes the Si—O—Si network stronger. Second, the combined use of organosilane and organofluorosilane enhances the noncovalent interactions between the organic side chains to promote better interactions that enhance the overall mechanical properties. Third, the increased interactions between the side chains promote a better filling of porous void space in the sol-gel network to make a homogenous and substantially nonporous coatings. Taken together, the unique combination of precursors along with the absence of porous microstructure and the enhanced side chain interactions between the organic groups provides the improved mechanical properties as compared to coatings of the prior art.

Figure 9:
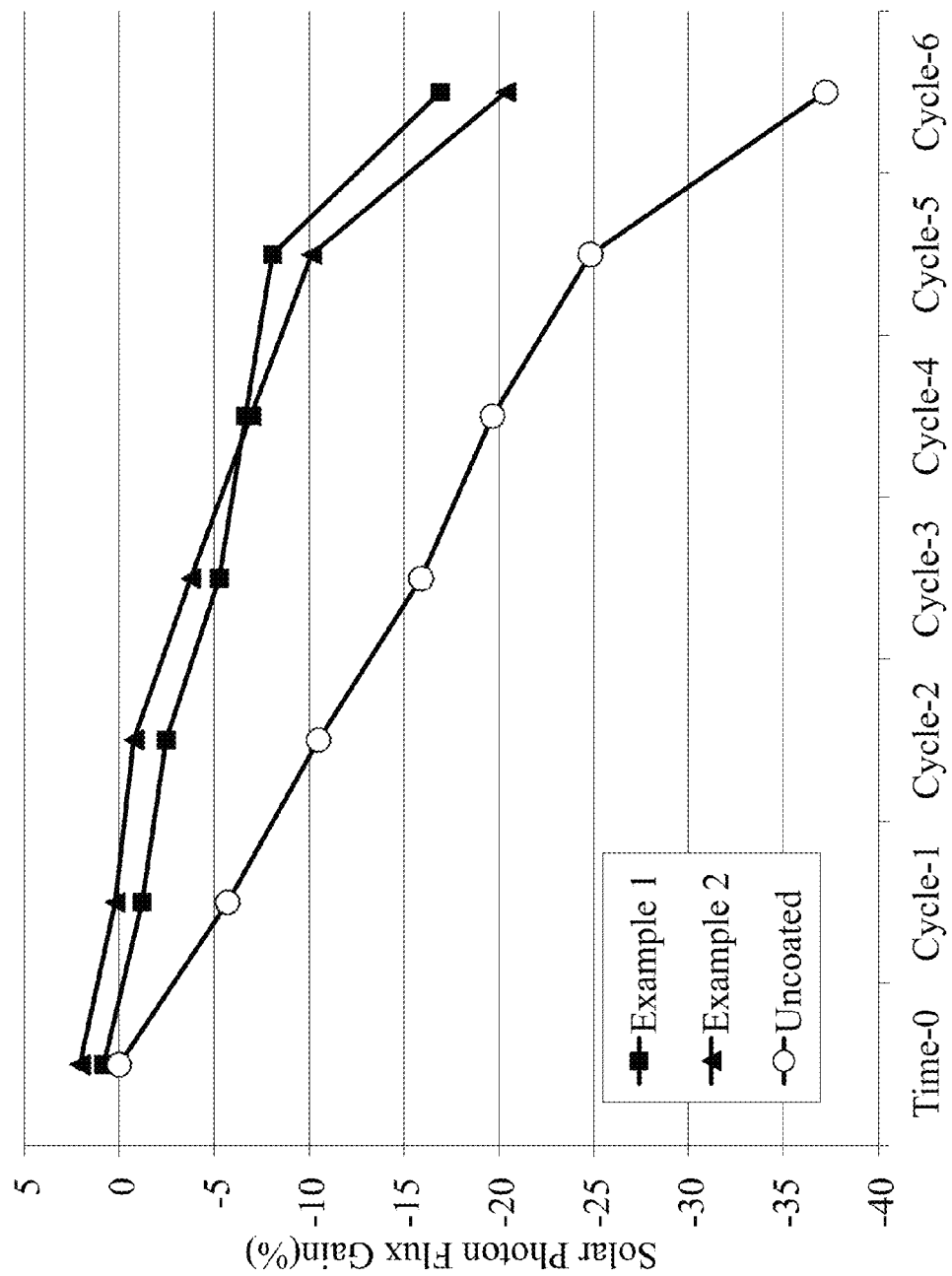
FIG. 9 illustrates the results of accelerated soiling studies on light transmission for coatings made according to some embodiments of the present disclosure.
Figure 10:
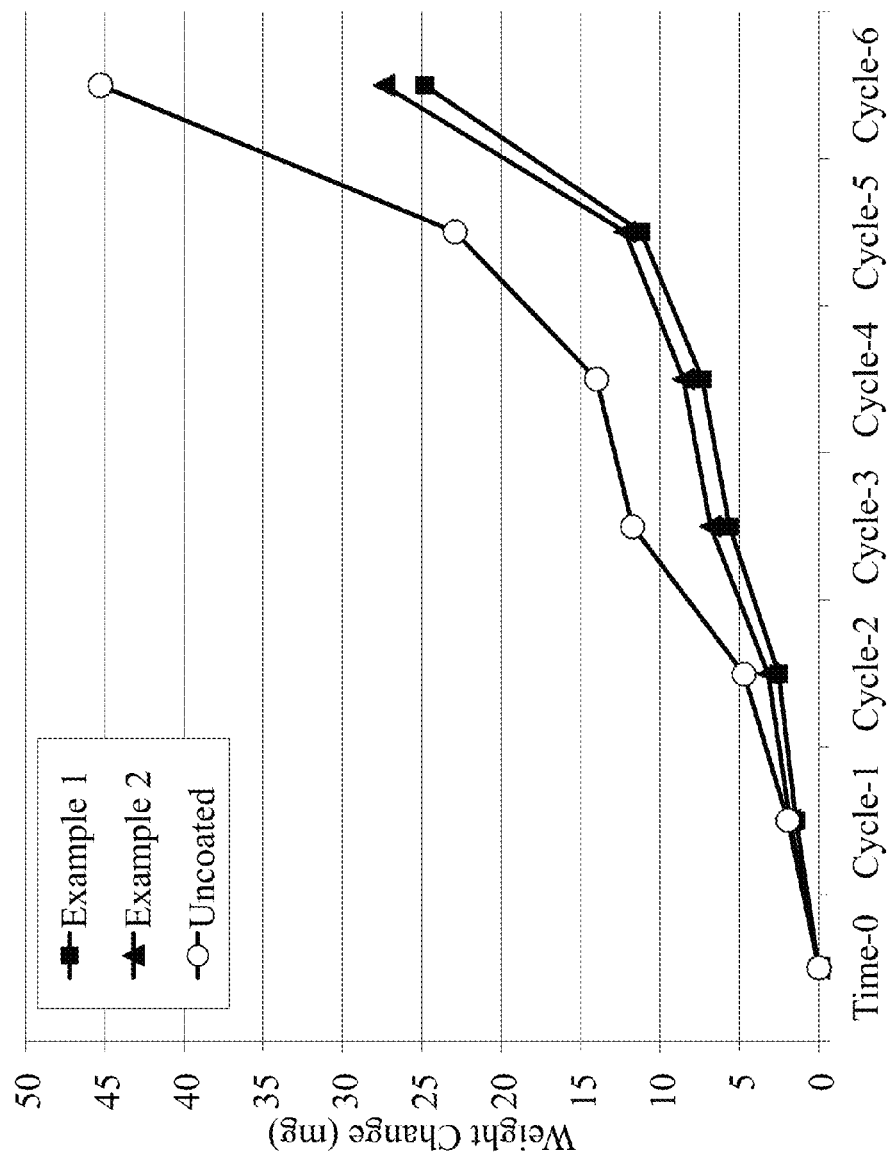
FIG. 10 illustrates the results of accelerated soiling studies on dirt adhesion for coatings made according to some embodiments of the present disclosure.

FIG. 9 illustrates the results of accelerated simulated soiling studies conducted in a laboratory environment showing the change in solar photon flux passing through the slides and FIG. 10 illustrates the change in weight with respect to sequential exposure of coated and uncoated glass slides to simulated dirt storm via wind-driven deposition of dirt particles. The anti-soiling behavior of the uncoated and coated slides was measured using the following procedure that simulated accelerated soiling of objects that are placed outdoor for extended periods. The absorption spectra of the coated and uncoated slides were measured to establish their transmittance. The both the slides were weighed. The slides were then placed in a freezer at 4° C. for 5 minutes and exposed to steam from boiling water for 30 seconds to make their moist with water vapor. These slides were then placed in dust chamber to deposit dust that was evenly dispersed by blowing air from a fan. Each slide was exposed to air dispersed with dirt for 3 minutes. The slides were then placed an IR lamp for 1 minute for radiant drying of the slides to remove moisture. Then the slides were placed in a wind machine that had air from a fan to remove any loosely held dirt particles. This step ensured that only strongly bound dirt particles were retained. These slides were then weighed to determine the excess weight due to deposited dirt. Finally, the transmission spectra of the slides were recorded to determine change light transmission due to deposition of dirt particles. This process was repeated for six cycles and the results of these are shown in FIGS. 9 and 10.

Figure 11:
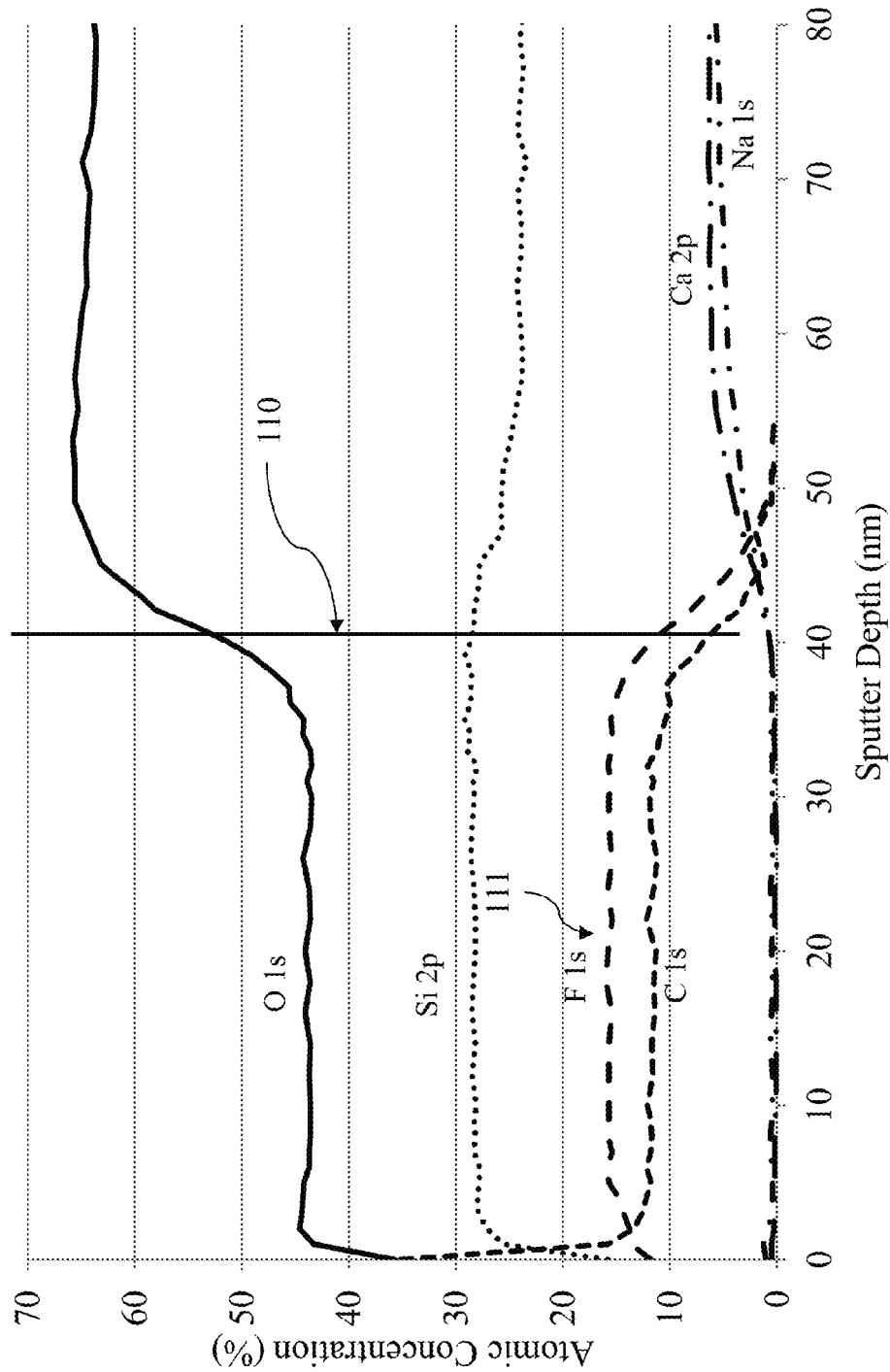
FIG. 11 shows an XPS cross section through a coating from the composition of Example 1 showing the elemental composition of the coating in vertical cross-section.

FIG. 11 shows a depth profile of a coating made from the composition of Example 1 on a surface of soda-lime glass. It was obtained by alternating XPS data acquisition cycles with sputter cycles. Material was removed from the sample using an Ar+ source. In order to eliminate crater wall effects, the data were acquired from a smaller region (300×1400 µm) in the center of the sputter area (4 mm×4 mm). Zalar rotation was used to minimize roughening of the samples due to ion

TABLE 3

| Coating | % Average Transmission Increase | Contact Angle | Refractive Index (ellipsometry) | Coating Thickness (ellipsometry) | Hardness (GPa) | Young's Modulus (GPa) |
| --- | --- | --- | --- | --- | --- | --- |
| Example 1 | 1.5% to 2.2% | 85-90° | 1.42 | 70-100 nm | 3.98 | 62.55 |
| Example 2 | 2.5% to 2.9% | 85-95° | 1.31 | 80-150 nm | 1.64 | 50.60 | bombardment. The sputter rate is calibrated using $SiO_2$, which can give a relative depth, but cannot be used as a measure of absolute depth.

FIG. 11 shows that the elemental composition of the coating is approximately 45% O, 28% Si, 15% F and 12% C. Furthermore the concentration of fluorine (111) in the coating is approximately constant through the full thickness of the coating. The disappearance of F and C and the appearance of Ca and Na are approximately indicated by the vertical line (110) which represents the transition from the coating to the underlying soda-lime glass substrate. By varying the ratio of organosilane to fluorosilane the percentage concentration of fluorine within the coating can be varied between about 20% and 1% and further between about 15% and 5%. Without being bound by theory, as the coating wears and abrades over time in an outdoor environment new fluorine will be exposed at the surface. This will lead to a more persistent hydrophobic and oleophobic property when compared to typical coatings such as those described herein where the hydrophobic component is a thin surface layer that quickly breaks down and wears off.

Figure 12:
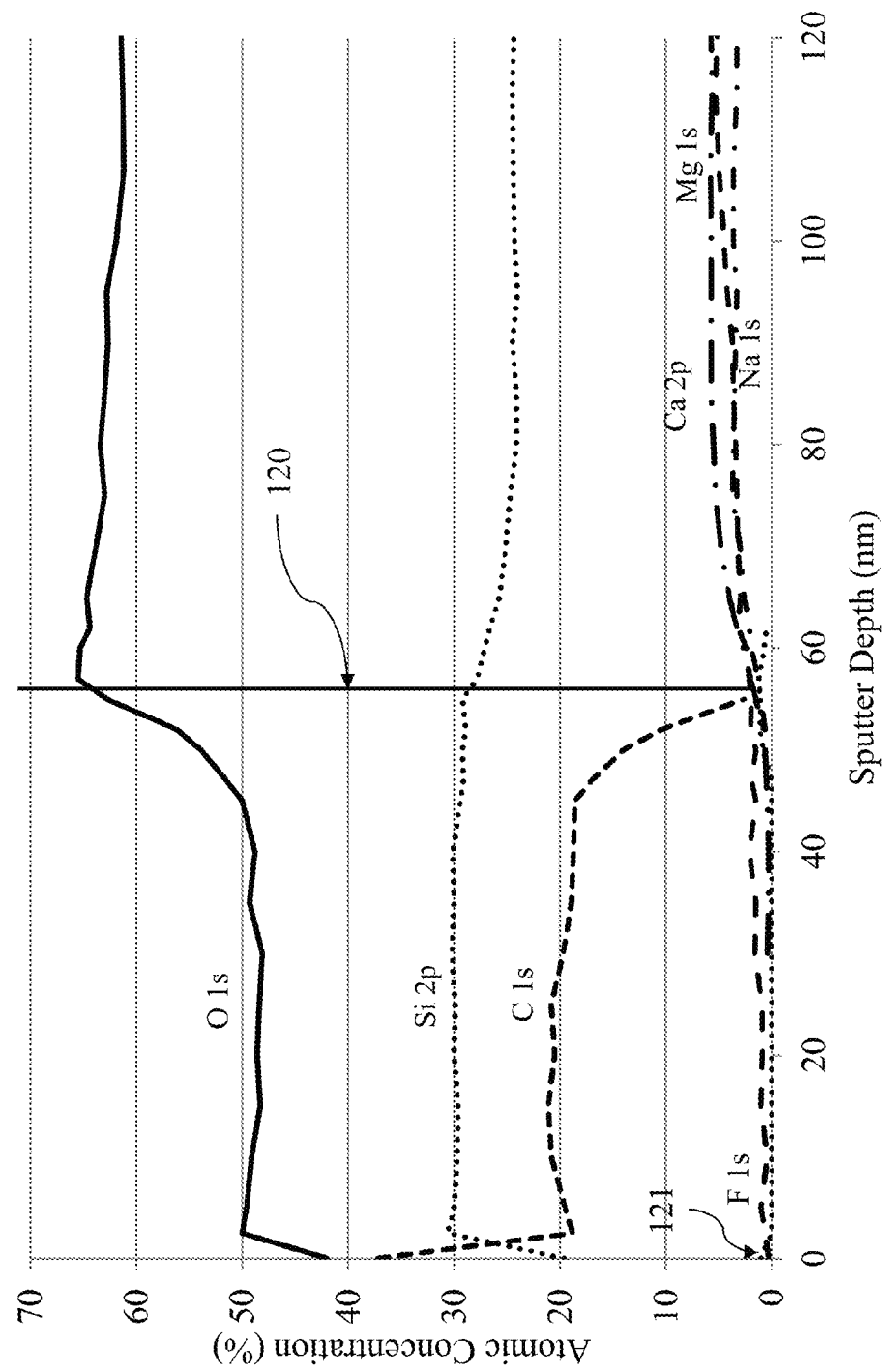
FIG. 12 shows an XPS cross section through a commercially available hydrophobic anti-reflective coating showing the elemental composition of the coating in vertical cross-section.

FIG. 12 shows a depth profile of a commercially available hydrophobic anti-reflective coating for solar modules manufactured by Changzhou Almaden Co., Ltd. It was obtained using the same method as used in the generation of FIG. 11. The line (120) marks the approximate transition from the coating to the underlying soda-lime glass as indicated by the disappearance of C and the appearance of Ca, Na and Mg.

FIG. 12 shows that the coating is composed of about 50% O, 30% Si and 20% C. 1% F was detected at the surface, but no F was detected in the bulk of the coating.

Figure 13:
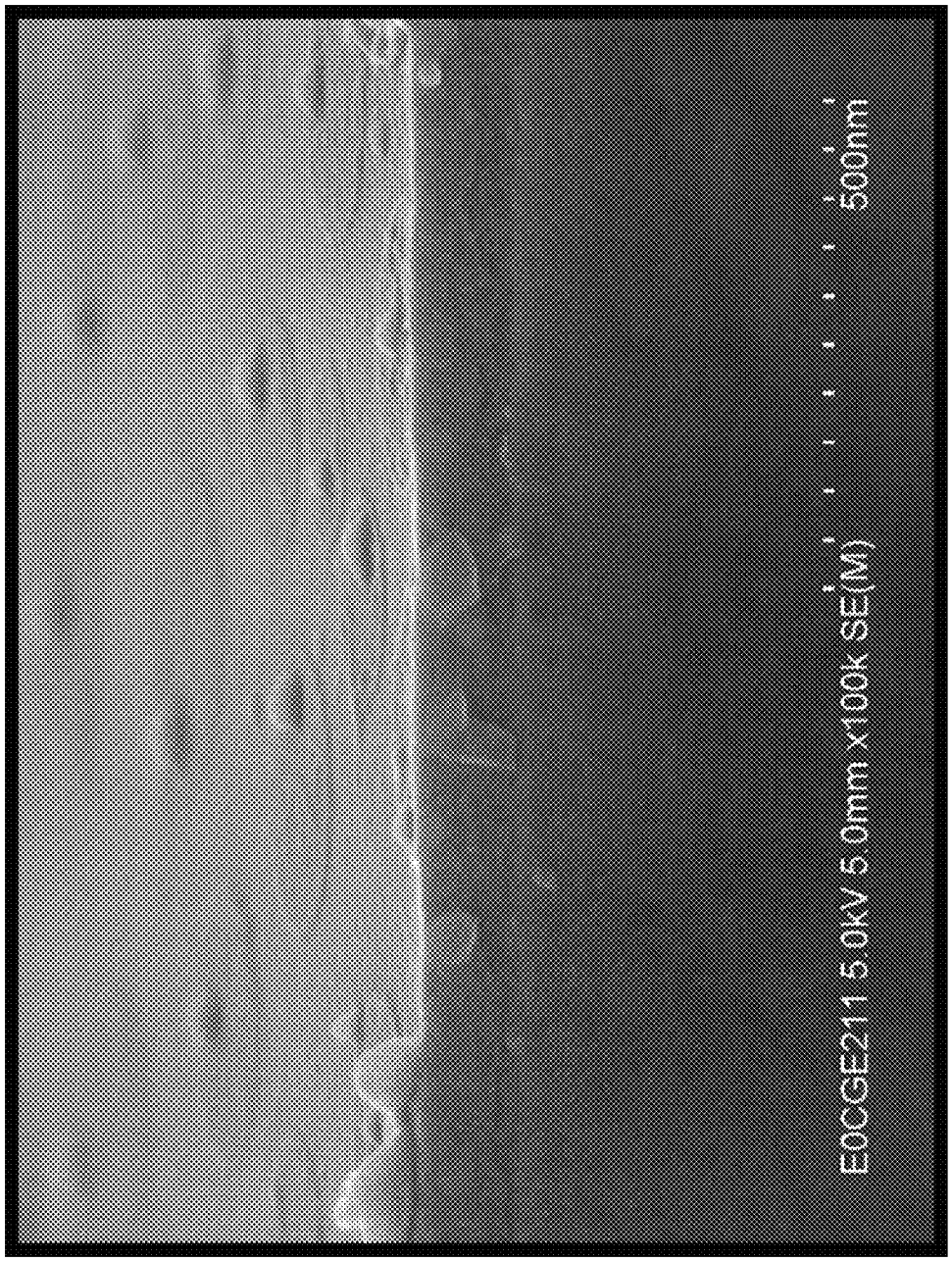
FIG. 13 shows an SEM oblique view and cross-section of a commercially available hydrophobic anti-reflective coating.

FIG. 13 shows an SEM oblique view and cross-section of a commercially available hydrophobic anti-reflective coating for solar modules manufactured by Changzhou Almaden Co., Ltd. This is another sample of the same coating that was analyzed in FIG. 12. It can be observed that the coating is approximately 100 nm to 150 nm thick. On the top surface of the coating, thin, circular disc-like structures are observed. Each disc has an associated raised bump. The sample exhibited a water contact angle of approximately 85° when measured by goniometer and is marketed as hydrophobic. The presence of these disc structures is consistent with the theory that a hydrophobic material, possibly a fluorosilane, has been deposited by spray or otherwise onto the finished surface of the coating to impart the hydrophobic property.

Commercially available hydrophobic glass coatings such as the Changzhou Almaden coating analyzed here are formed by applying a thin continuous or discontinuous mono-layer of fluorosilane to the surface. These coatings do not exhibit persistent hydrophobicity when exposed to an outdoor environment. The thin layer of fluorocarbon attached to the surface is prone to removal by abrasion during cleaning and from environmental factors such as windborne dust. It is also prone to oxidative breakdown caused by exposure to UV radiation and to moisture. In general, these classes of coatings do not last more than 12~24 months in typical outdoor environments and may last for much shorter times in harsh environments such as desert or tropical areas, such as for example in Arizona and Florida.

Figure 14:
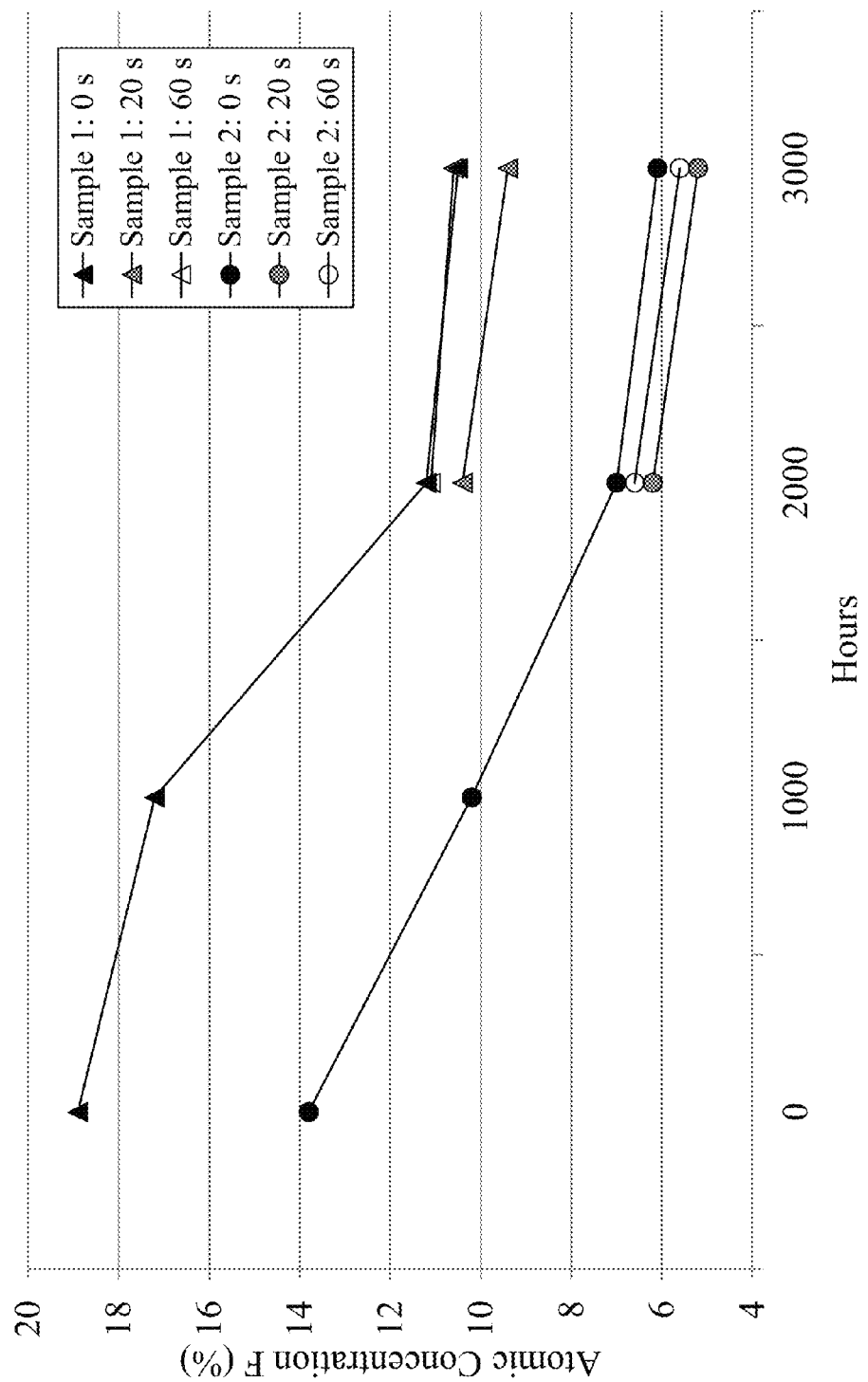
FIG. 14 shows changes in atomic concentration of fluorine during 3000 hours of accelerated environmental stress testing derived from XPS analysis of two samples made according to the embodiments of the disclosure.

FIG. 14 shows results of surface and bulk elemental analysis using XPS on two samples prepared according to the method of Example 1 that have been aged over 3000 hours. Sample 1 used a ratio of organosilane to fluorosilane of 1 and Sample 2 used a ratio of 0.5. A Ci4000 Weather-Ometer (ATLAS Material Testing Technology LLC) was used to perform indoor aging of the samples. The chamber temperature of 60° C. and relative humidity (RH) of 60% were used in the instrument. Water spray was not used during the aging. Specimens were placed on a carousel that rotates about a xenon-arc lamp. An inner glass filter (Right Light, ATLAS Material Testing Technology LLC) was used to filter the lamp in conjunction with a coated infrared absorbing quartz outer glass filter so that the lamp closely replicates the AM1.5 spectrum, with the power level being controlled to 114 $W \cdot m^{-2}$ for 300≤λ≤400 nm, i.e., 2.5× the AM1.5 global spectrum in IEC 60904-3. The Ci4000 therefore provides ~10× the raw UV daily dose, based on its intensity and continuous operation throughout the day. The duration of 3000 cumulative hours would therefore be equivalent to at least 3.5 years in the field, based on UV irradiation alone. For aging in the Ci4000, specimens were placed in stainless steel holders (ATLAS Material Testing Technology LLC), with the coated surface facing the Xe lamp. Specimens were not masked in the Ci4000, other than at the 5 mm periphery of the sample holders used to secure the specimens within the Ci4000.

The samples were analyzed with XPS before the aging was started and then at the 1000, 2000 and 3000 hour read-points. At all read-points the XPS analysis was carried out on the coating surface. At the 2000 and 3000 hour read-points, the XPS analysis was also carried out after 20 seconds and 60 seconds of Ar+ sputtering. This step etches away some of the coating material to expose fresh underlying material. It also removes any surface contamination. In the case of fluorine concentration, there was good correlation between the surface concentration and the interior concentration, suggesting there was little external contamination of the surface by fluorine.

FIG. 14 shows that the fluorine content of the coating that is responsible for the persistent hydrophobic property is robust when exposed to accelerated environmental conditions of UV, temperature and humidity. While the fluorine content is reduced over the period of the stress, more than half remains at the end of the stress. Additionally, the rate of reduction of fluorine as evidenced by the slope of the graph between the 2000 hour and 3000 hour read-points relative to the slope of the graph between the 0 hour and 2000 hour read-points is less.

Embodiments described herein are well suited to performing various other steps or variations of the steps recited herein, and in a sequence other than that depicted and/or described herein.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the disclosure.

Similarly, it should be appreciated that in the foregoing description of exemplary embodiments of the disclosure, various features of the disclosure are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference.

The invention claimed is:

1. A coated glass element, comprising:
a glass component; and
a coating adhered to the glass component through siloxane linkages, the coating having at least one of an anti-reflective property, an abrasion resistance property and a hydrophobic property;
wherein the coating comprises a dried gel formed from at least one hydrolyzed tetra-alkoxysilane-based sol and at least one hydrolyzed organosilane-based sol.

2. The element of claim 1, wherein the glass component is a component of a solar module.

3. The element of claim 1, wherein the glass component is a component of a window.

4. The element of claim 1, wherein the glass component is a component of a mirror.

5. The element of claim 1, wherein the glass component is tempered.

6. The element of claim 1, wherein the hydrolyzed organosilane is prepared separately before combining with the tetra-alkoxysilane or with another reagent.

7. The element of claim 1, wherein a first side of the glass component is first coated with the coating and a second side is first coated with a transparent conductive oxide.

8. The element of claim 7, wherein the transparent conductive oxide is the front electrode of a thin film solar panel.

9. The element of claim 1, wherein the coated glass element has an increased optical transmission of 1% to 3% on an absolute basis compared to an uncoated glass element.

10. The element of claim 1, wherein the glass component is a component of a solar module and the coating increases a peak power output of the solar module by 1.0% to 3.0% compared to a solar module with an uncoated glass component.

11. The element of claim 1, wherein the coating has abrasion resistance sufficient to pass standard EN1096-2 with an absolute loss of transmission of no more than 0.5% and enables a post-test light transmission gain of greater than 1% on an absolute basis as compared to uncoated glass.

12. The element of claim 1, wherein the coating has the anti-reflective property and a thickness of 60 nm to 150 nm.

13. The element of claim 1, wherein the coating has the anti-reflective property and a thickness of the coating is adapted to enhance solar transmission between 400 nanometers and 1150 nanometers.

14. The element of claim 1, wherein the coating has a water contact angle of 80 degrees to 178 degrees.

15. The element of claim 1, wherein the dried gel further comprises a hydrolyzed organofluorosilane-based sol.

16. The element of claim 1, wherein the glass component is untempered.

17. A coated glass element, comprising:
a float glass component; and
a coating adhered to a tin-side of the float glass component through siloxane linkages, the coating having at least one of an anti-reflective property, an abrasion resistance property,
and a hydrophobic property, wherein the coating comprises a dried gel formed from a combination of sols comprising:
a hydrolyzed organosilane-based sol and a hydrolyzed tetra-alkoxysilane sol,
wherein the coated glass element has greater light transmission than a coated glass element wherein the coating is adhered to a non-tin-side of the float glass component, and
wherein the high abrasion resistance property of the coating is tunable by varying relative proportions of the hydrolyzed organosilane and the hydrolyzed tetra-alkoxysilane.

18. The element of claim 17, wherein the float glass component is a component of a solar module.

19. The element of claim 17, wherein the float glass component is a component of a window or a mirror.

20. The element of claim 17, wherein the float glass component is a component of a solar module and the coating increases a solar weighted photon gain of the solar module by at least 10.0% when applied to the tin-side as compared to when applied to the non-tin side.

21. The element of claim 17, wherein the hydrolyzed organosilane comprises methyltrimethoxysilane (MTMOS).

22. The element of claim 17, wherein the non-tin-side of the float glass component is coated with a transparent conductive oxide.

23. The element of claim 22, wherein the transparent conductive oxide is a front electrode of a thin film solar panel.

24. The element of claim 17, wherein the coated glass element has an increased optical transmission of 1% to 3% on an absolute basis compared to an uncoated glass element.

25. The element of claim 17, wherein the float glass component is a component of a solar module and the coating increases a peak power output of the solar module by 1.0% to 3.5% compared to a module with an uncoated float glass component.

26. The element of claim 17, wherein the coating has abrasion resistance sufficient to pass standard EN1096-2 with an absolute loss of transmission of no more than 0.5% and enables a post-test light transmission gain of greater than 1% on an absolute basis as compared to uncoated glass.

27. The element of claim 17, wherein the coating has the anti-reflective property and a thickness of 60 nm to 150 nm.

28. The element of claim 17, wherein the coating has the anti-reflective property and a thickness of the coating is adapted to enhance solar transmission between wavelengths of 400 nanometers and 1150 nanometers.

29. The element of claim 17, wherein the hydrolyzed tetra-alkoxysilane is selected from the group consisting of tetraethoxysilane (TEOS) and tetramethoxysilane (TMOS).

30. The element of claim 17, wherein the dried gel further comprises a hydrolyzed organofluorosilane based sol.

* * * * *